United States Patent
Otsuka et al.

(10) Patent No.: US 10,700,116 B2
(45) Date of Patent: Jun. 30, 2020

(54) REAR-SURFACE-INCIDENT SOLID STATE IMAGING ELEMENT AND METHOD FOR MANUFACTURING SAME

(71) Applicant: HAMAMATSU PHOTONICS K.K., Hamamatsu-shi, Shizuoka (JP)

(72) Inventors: Shinya Otsuka, Hamamatsu (JP); Hisanori Suzuki, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/069,342

(22) PCT Filed: Dec. 28, 2016

(86) PCT No.: PCT/JP2016/089085
§ 371 (c)(1),
(2) Date: Jul. 11, 2018

(87) PCT Pub. No.: WO2017/122545
PCT Pub. Date: Jul. 20, 2017

(65) Prior Publication Data
US 2019/0027521 A1    Jan. 24, 2019

(30) Foreign Application Priority Data

Jan. 13, 2016  (JP) ................... 2016-004608

(51) Int. Cl.
*H01L 27/146*   (2006.01)
*H01L 27/144*   (2006.01)
(Continued)

(52) U.S. Cl.
CPC ......... *H01L 27/1464* (2013.01); *H01L 27/14* (2013.01); *H01L 27/144* (2013.01);
(Continued)

(58) Field of Classification Search
None
See application file for complete search history.

(56) References Cited

FOREIGN PATENT DOCUMENTS

| JP | 2000-138365 A | 5/2000 |
|----|---------------|--------|
| JP | 2002-289908 A | 10/2002 |

(Continued)

OTHER PUBLICATIONS

International Preliminary Report on Patentability dated Jul. 26, 2018 for PCT/JP2016/089085.

*Primary Examiner* — David E Graybill
(74) *Attorney, Agent, or Firm* — Faegre Drinker Biddle & Reath LLP

(57) ABSTRACT

In a back-illuminated solid-state image pickup device, a first group of charge transfer electrodes (vertical shift register) is present in an imaging region, and a second group of charge transfer electrodes (horizontal shift register) is present in a peripheral region around the imaging region. The light incident surface of the semiconductor substrate 4 corresponding to the peripheral region is etched, and an inorganic light shielding substance SH is filled in the etched region. The amount of the inorganic light shielding substance that evaporates and vaporizes under the vacuum environment is extremely small, and the influence on the imaging by the vaporized gas is small.

8 Claims, 14 Drawing Sheets

(51) Int. Cl.
  *H01L 27/14*  (2006.01)
  *H01L 27/148*  (2006.01)
  *H04N 5/372*  (2011.01)

(52) U.S. Cl.
  CPC .. *H01L 27/14623* (2013.01); *H01L 27/14812* (2013.01); *H04N 5/372* (2013.01)

(56)  References Cited

FOREIGN PATENT DOCUMENTS

| | | |
|---|---|---|
| JP | 2004-31452 A | 1/2004 |
| JP | 2009-117454 A | 5/2009 |
| JP | 2010-80687 A | 4/2010 |
| JP | 2010-134352 A | 6/2010 |
| JP | 2015-520939 A | 7/2015 |
| WO | WO-2013/155011 A1 | 10/2013 |

Fig.5
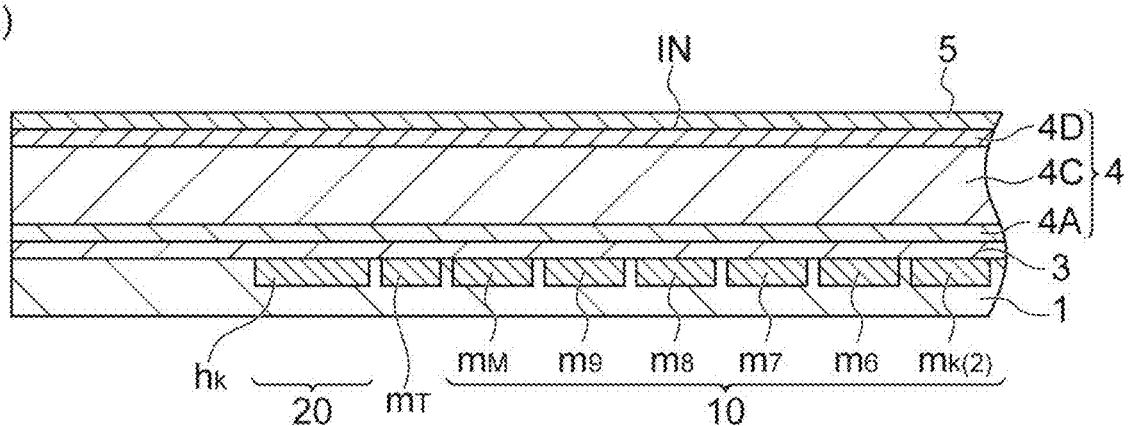
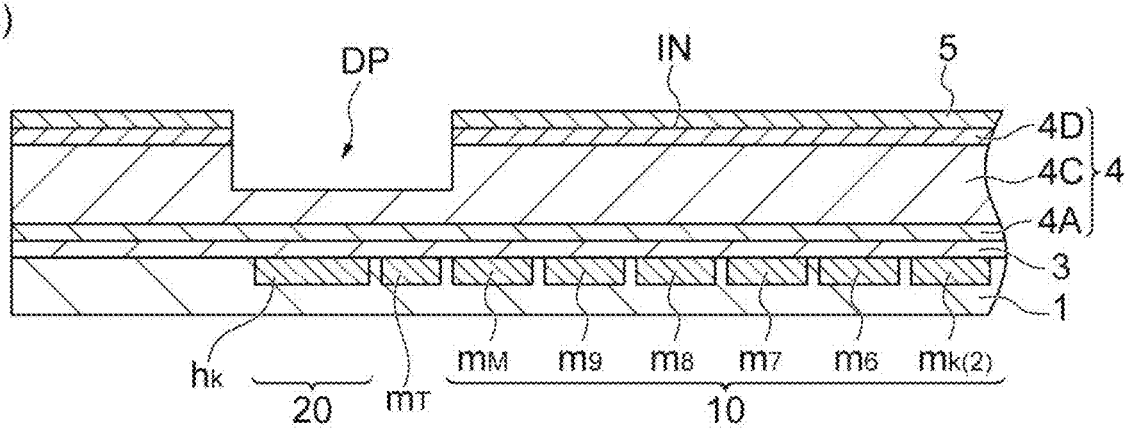
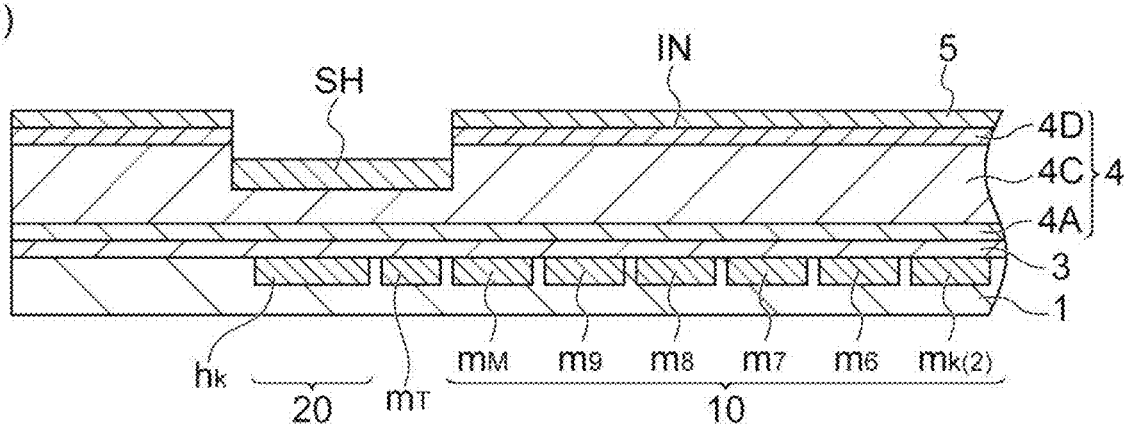
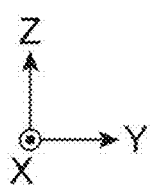

Fig.6
(A)
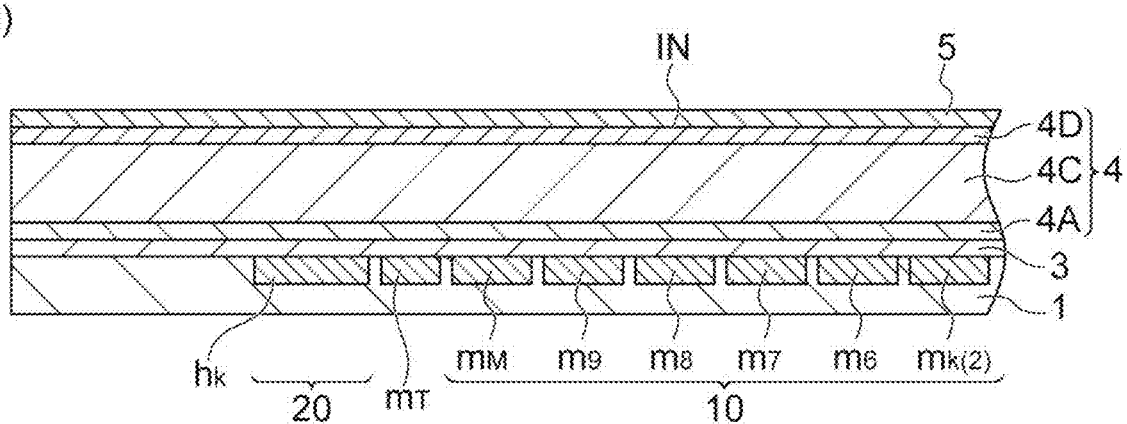
(B)
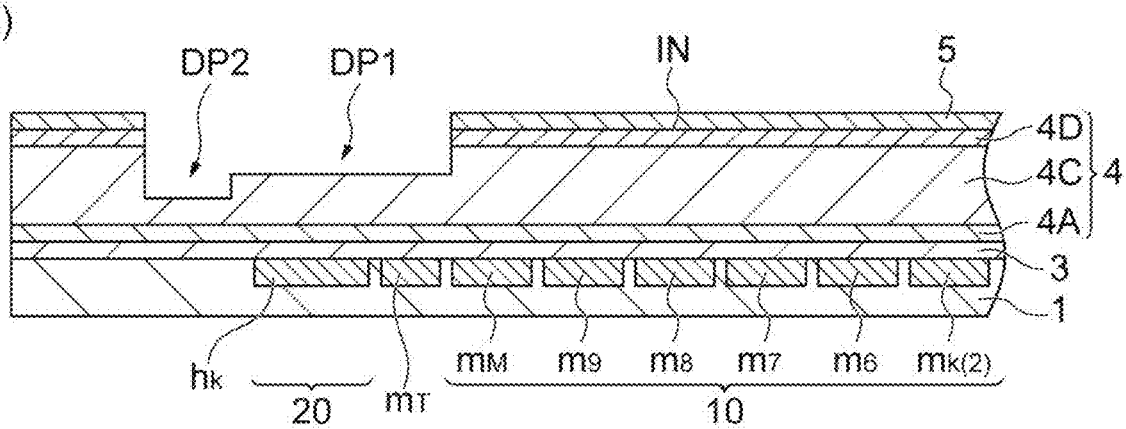
(C)
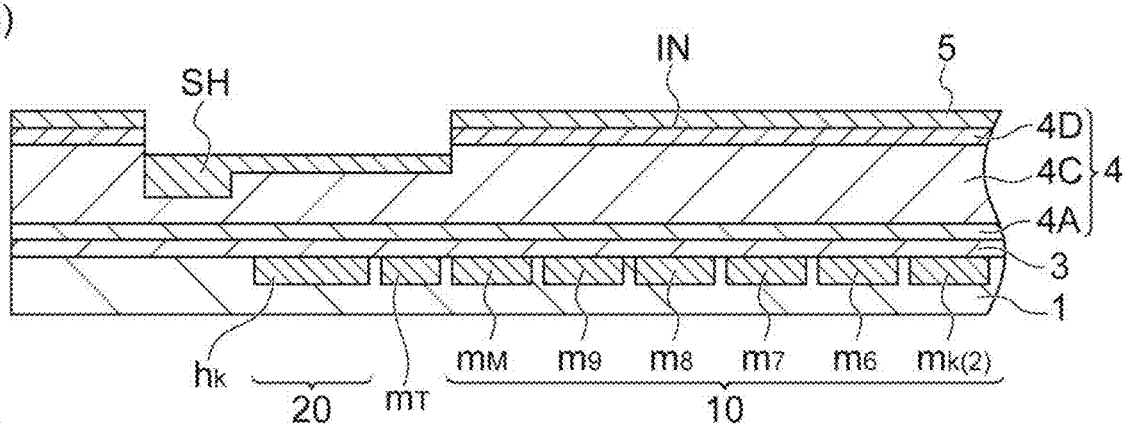

Fig.7
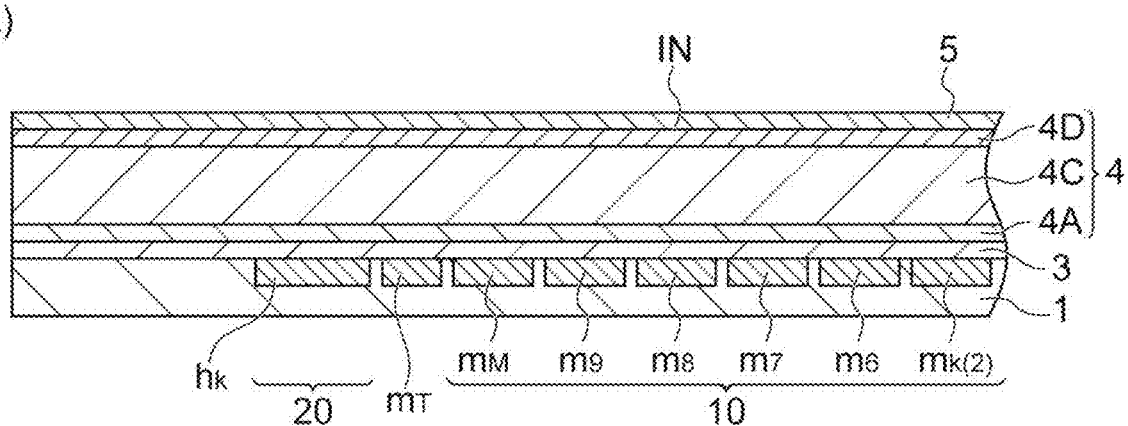
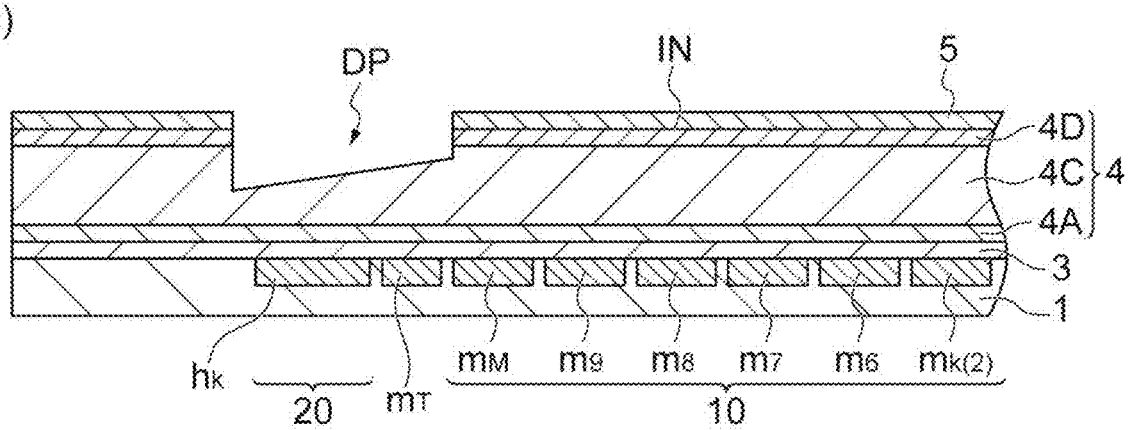
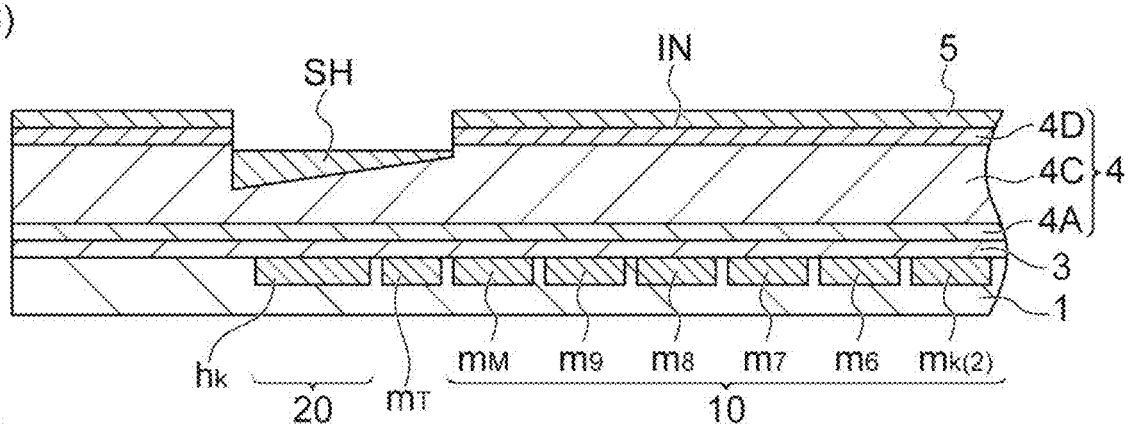
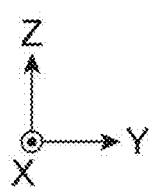

Fig.8
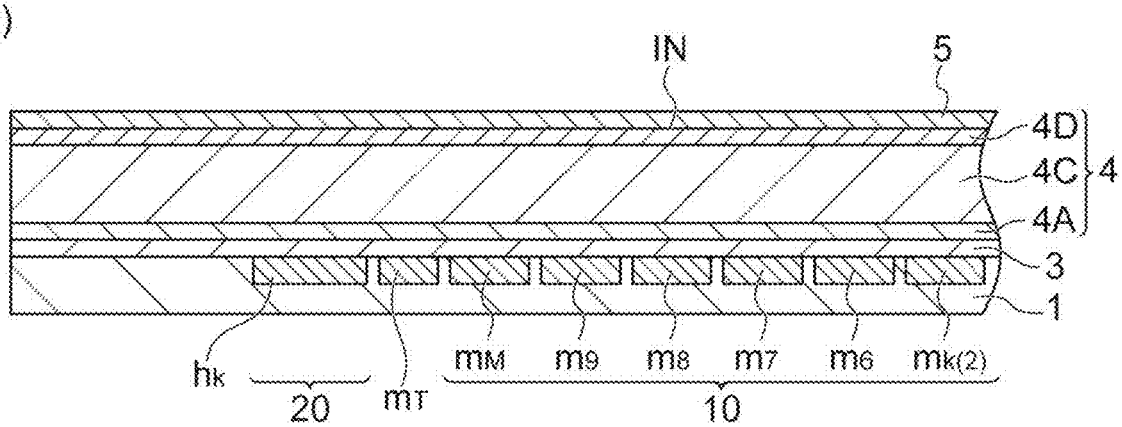
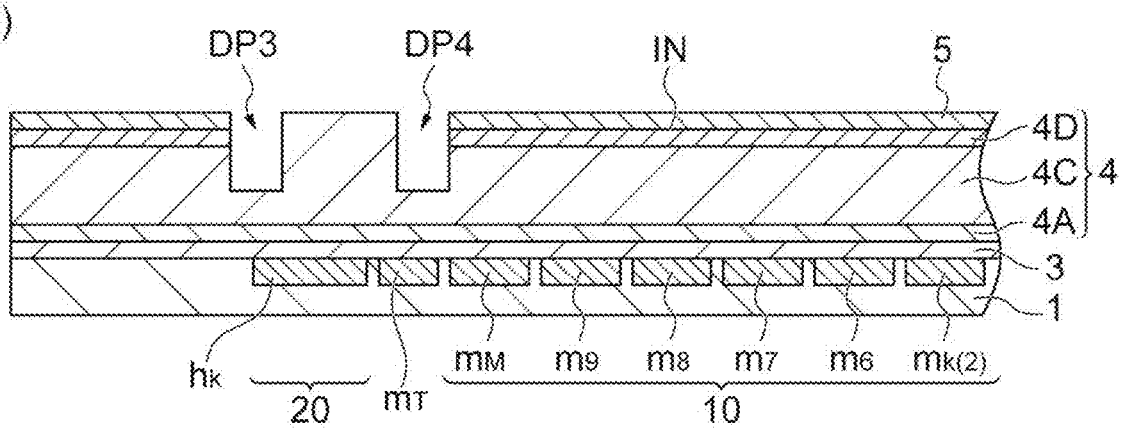
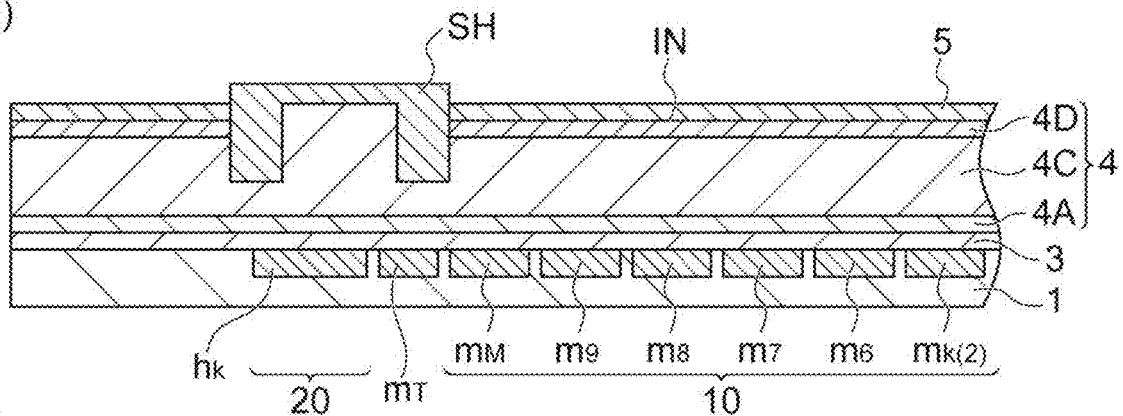
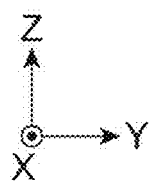

Fig.9
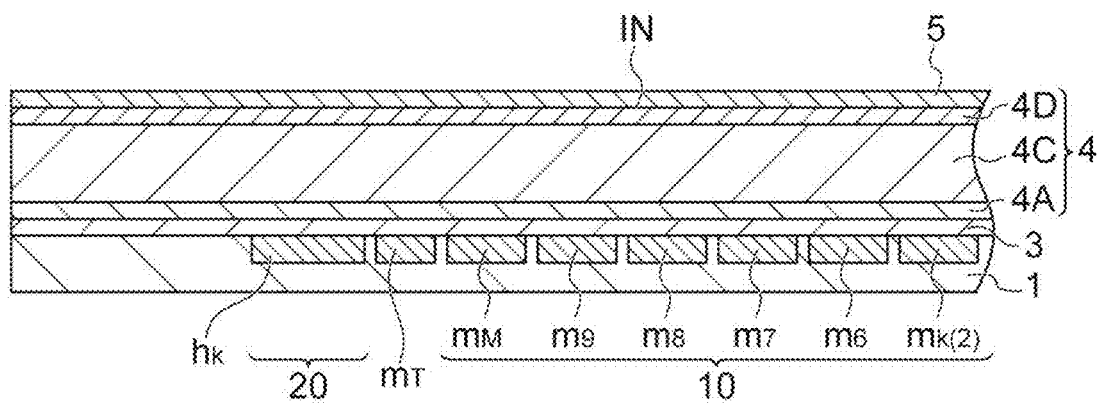
(A)
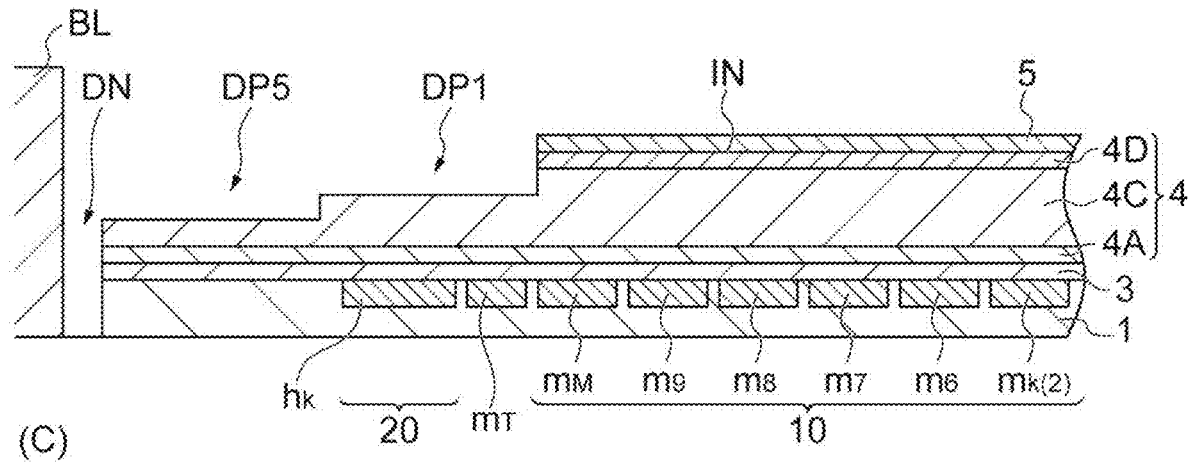
(B)
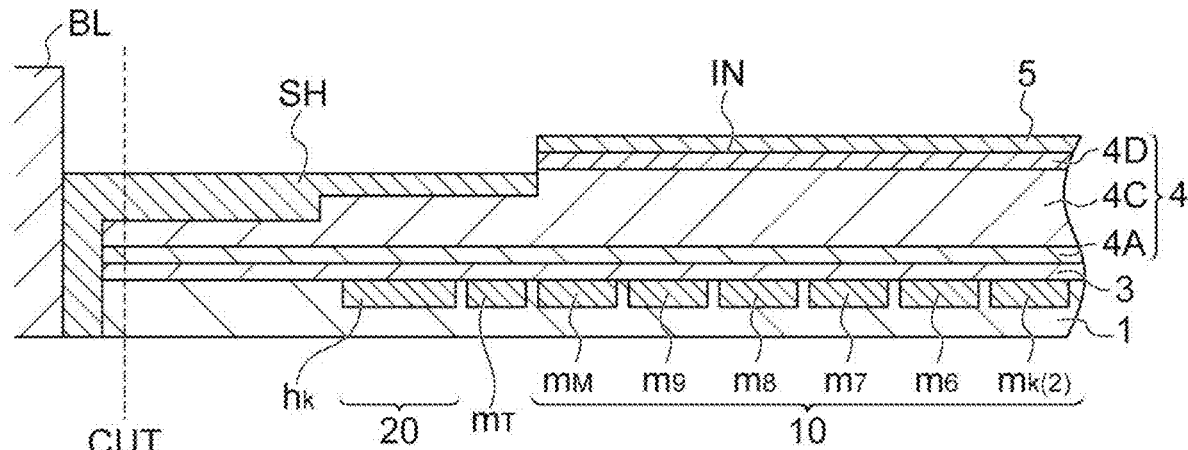
(C)
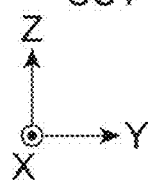

*Fig.10*
(A)
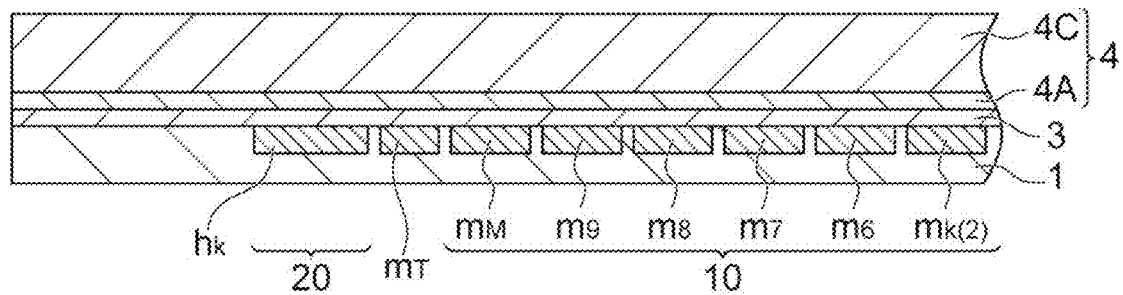
(B)
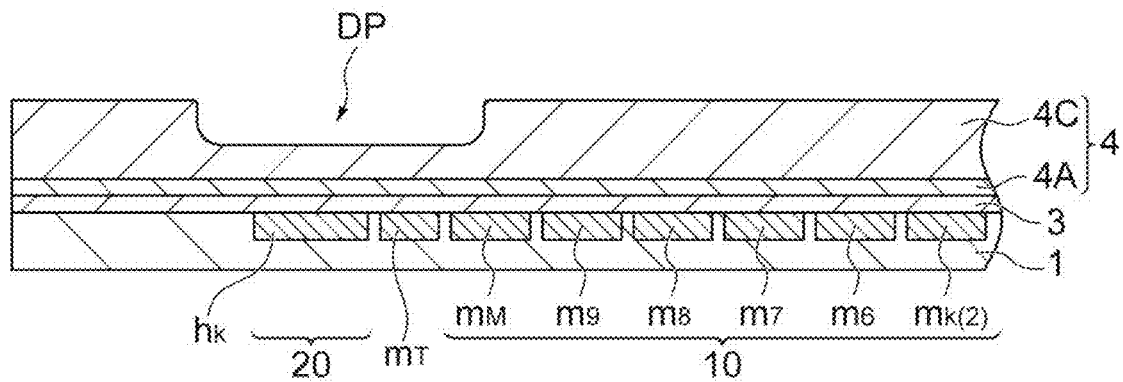
(C)
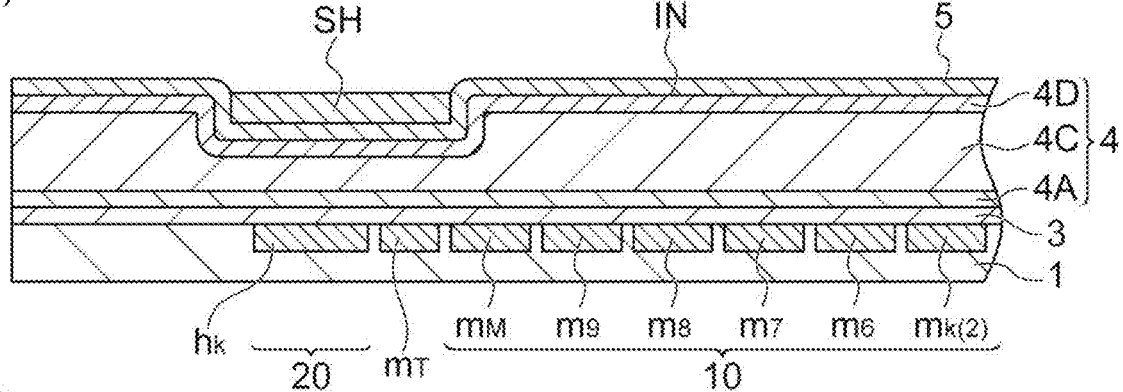
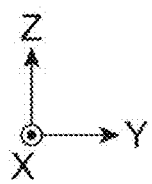

*Fig.11*
(A)
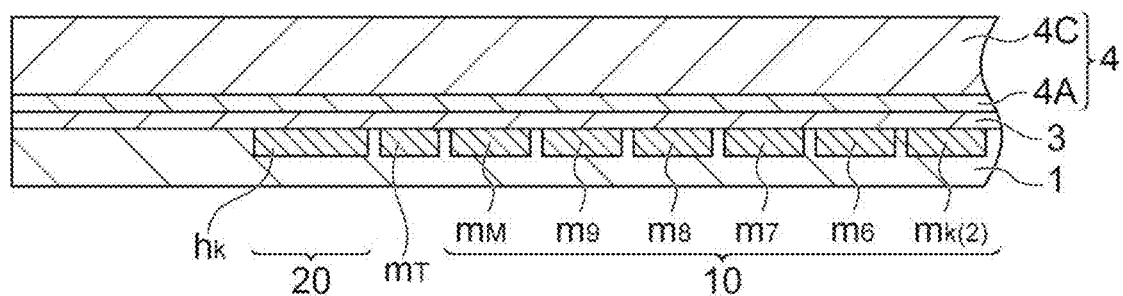
(B)
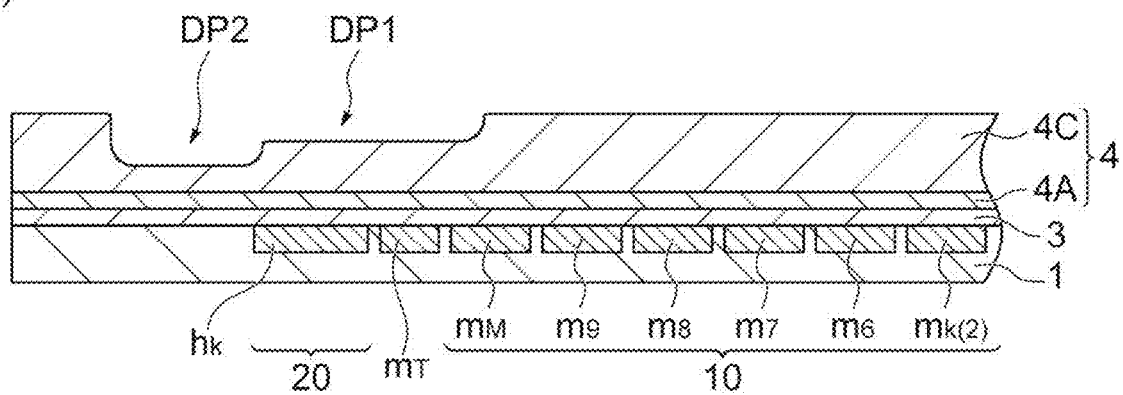
(C)
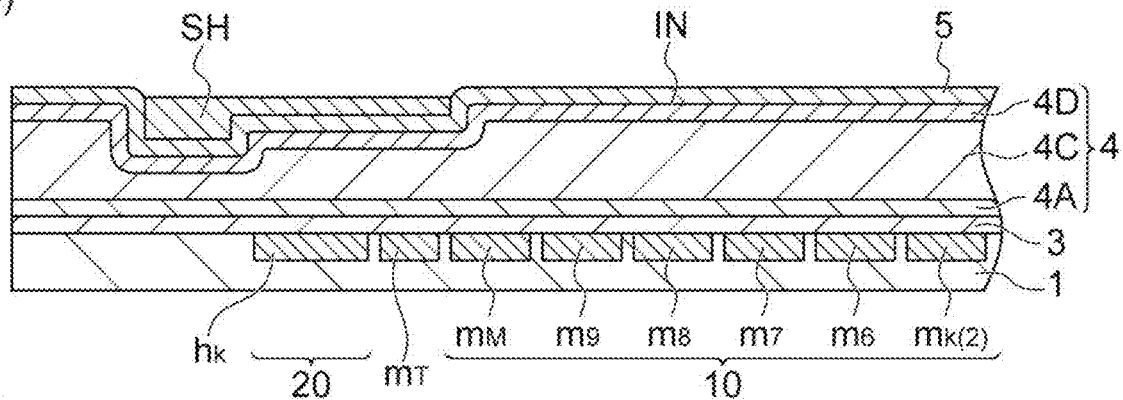

Fig.12
(A)
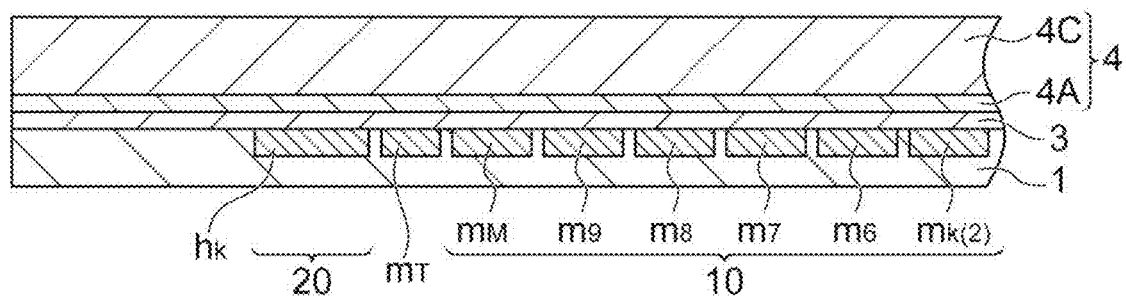
(B)
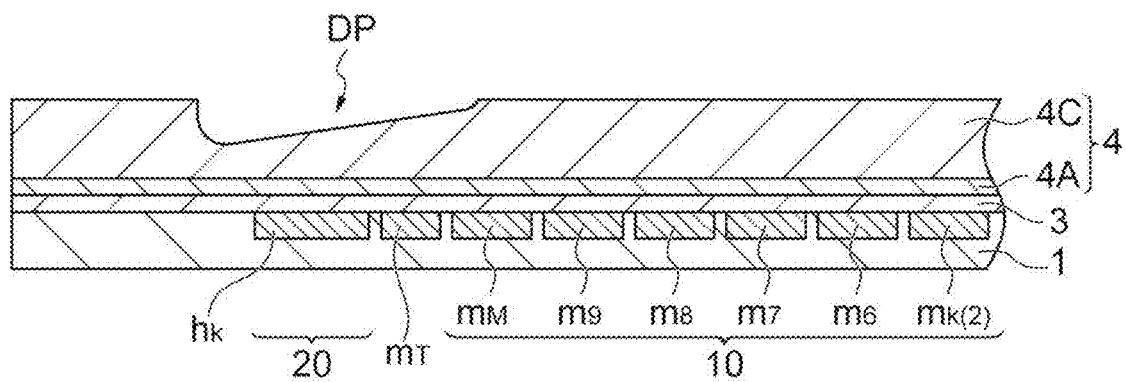
(C)
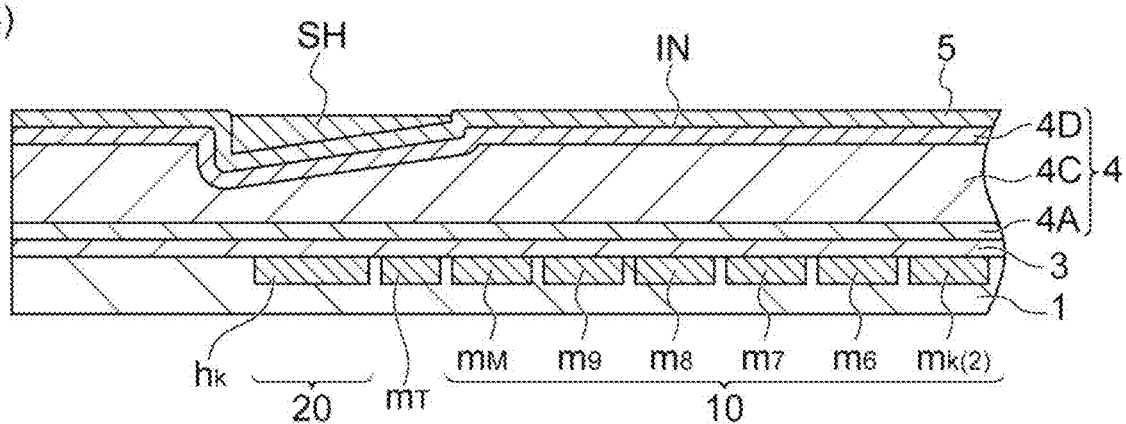

Fig.13
(A)
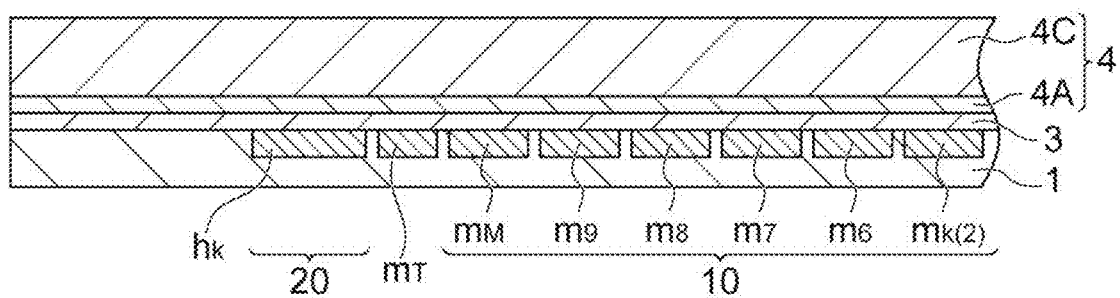
(B)
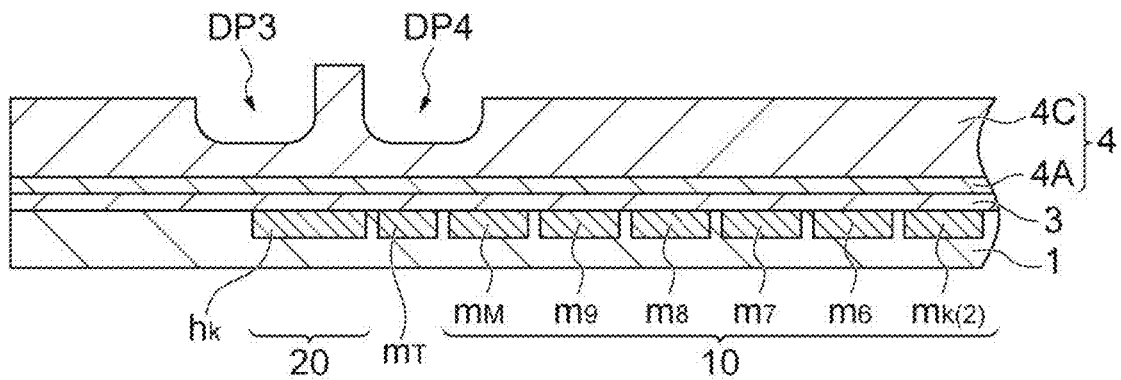
(C)
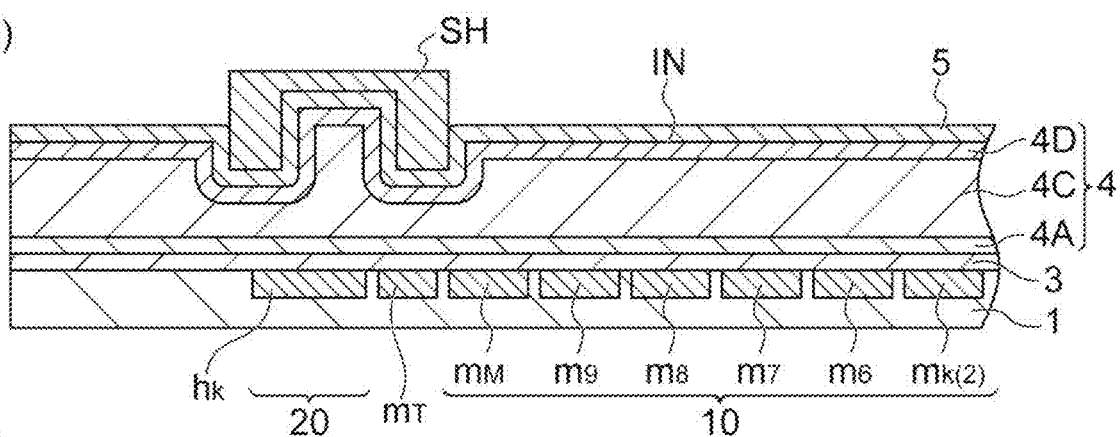
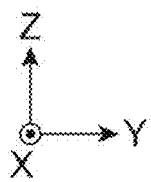

Fig.14
(A)
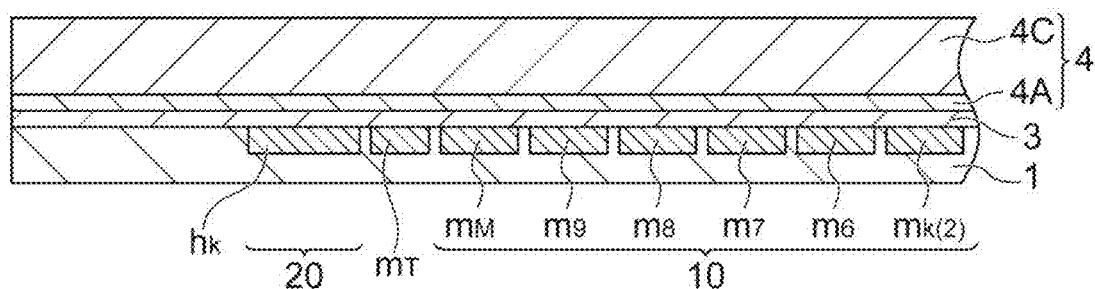
(B)
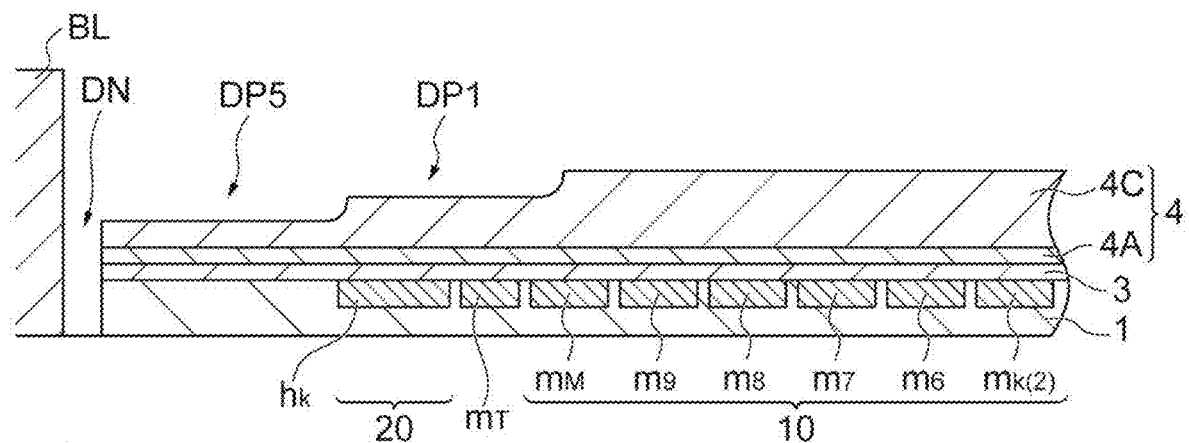
(C)
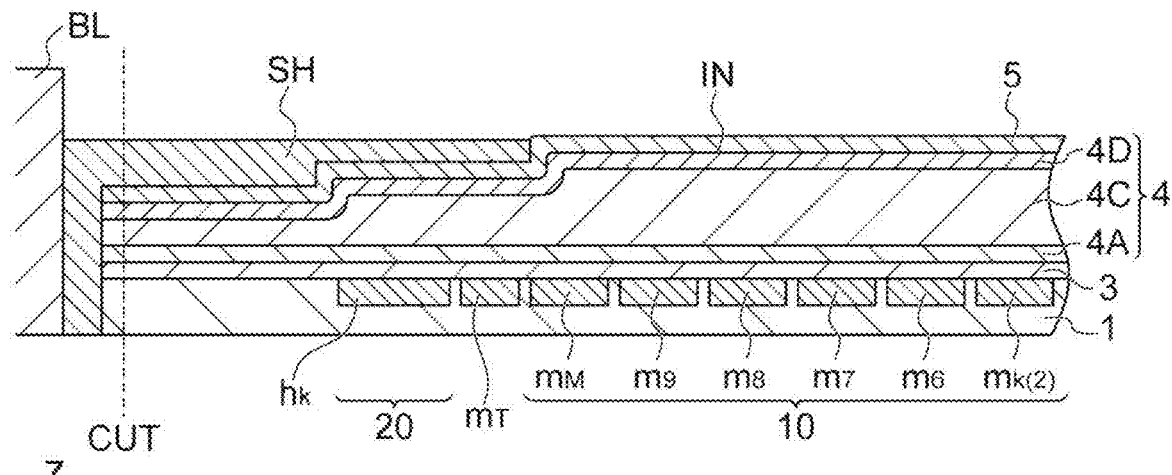
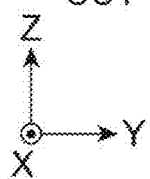

REAR-SURFACE-INCIDENT SOLID STATE IMAGING ELEMENT AND METHOD FOR MANUFACTURING SAME

TECHNICAL FIELD

The present invention relates to a back-illuminated solid-state image pickup device and a method for manufacturing the same.

BACKGROUND ART

In a lithography technique for performing short wavelength exposure, it is expected to use a back-illuminated solid-state image pickup device for monitoring an object and an exposure beam. Extreme ultraviolet lithography (EUVL) is known as a high-precision lithography technique. However, since extreme ultraviolet rays (EUV) having a wavelength of 13.5 nm used in EUVL are also absorbed by gas, exposure in lithography is performed in a vacuum environment. Therefore, it is expected that the back-illuminated solid-state image pickup device can also be used in vacuum. Heretofore, various elements using light shielding films are known (Patent Literature 1, Patent Literature 2).

CITATION LIST

Patent Literature

[Patent Literature 1] Japanese Unexamined Patent Publication No. 2010-134352
[Patent Literature 2] Japanese Unexamined Patent Publication No. 2002-289908

SUMMARY OF INVENTION

Technical Problem

However, in a case where a back-illuminated solid-state image pickup device is disposed in a vacuum, gas may be emitted from the back-illuminated solid-state image pickup device, which may influence the absorption of light in exposure and imaging. The present invention has been made in view of such a problem, and an object is to provide a back-illuminated solid-state image pickup device capable of suppressing the generation of gas in a vacuum environment and capable of capturing an image with low noise in a vacuum environment, and a method for manufacturing the same.

Solution to Problem

In order to solve the above problem, a first back-illuminated solid-state image pickup device includes a semiconductor substrate having a light incident surface, a first group of charge transfer electrodes provided on a surface of the semiconductor substrate opposite to the light incident surface, and a second group of charge transfer electrodes that further transfers charges transferred by the first group of charge transfer electrodes in a horizontal direction, in which the first group of charge transfer electrodes is disposed in an imaging region, the second group of charge transfer electrodes is disposed in a peripheral region of the imaging region, the light incident surface of the semiconductor substrate corresponding to the peripheral region is etched, and an inorganic light shielding substance is filled in the etched region.

According to the back-illuminated solid-state image pickup device, since the first group of charge transfer electrodes is provided on the side opposite to the light incident surface, charges are generated in the imaging region in response to light incidence, without being obstructed by the electrode groups, and thus imaging with high sensitivity can be performed. The charges transferred by the first group of charge transfer electrodes are read and output by the second group of charge transfer electrodes in the horizontal direction. When light enters the peripheral region of the imaging region, it becomes unnecessary noise. In the back-illuminated solid-state image pickup device, the light incident surface of the semiconductor substrate corresponding to the peripheral region is etched, and the light shielding substance is filled in the etched region. Therefore, noise generation due to incidence of light in the peripheral region is suppressed. In addition, since the light shielding substance is an inorganic compound, the vapor pressure of the light shielding substance in the vacuum environment is lower than that of the organic compound, and generation of gas is suppressed.

Since the inorganic compound is not an organic compound and it is not a metal, it is a substance which does not have gloss. Therefore, not only gas generation is suppressed, but also reflectance is lower than that of metal, so that reflected light can be prevented from becoming new noise as stray light in an exposure apparatus.

As the inorganic compound, black carbon, black ceramic, or black metal oxide can be used. As the inorganic compound, an inorganic compound having a light shielding effect such as silica beads can also be used. As the black carbon, hydrophilic carbon black, hydrophobic carbon black, carbon nanotube, or the like can be used. As the black ceramic, Co—Cr—Fe, Co—Mn—Fe or the like can be used. As the black metal oxide, black iron oxide, titanium oxide, and other metal oxide pigments (mineral pigments) can be used. In addition, in a case where the solute is a hydrophilic material, the solvent with water as a main component can be used, and in the case of a hydrophobic material, oil, thinner, alcohol or the like can be used. As a solution of a ceramic pigment, a siloxane-based (—Si—O—) solution is known.

In order to accelerate the dispersion of the light shielding substance in the solvent, surfactants can be used, or binder resins can be used in combination. In addition, it is also possible to combine an emulsifier, PH regulator and the like to form a light shielding substance-containing solution to be supplied at the time of filling.

Further, in the second back-illuminated solid-state image pickup device, the thickness of the semiconductor substrate is 200 μm or less in both the imaging region and the peripheral region. By polishing the entire semiconductor substrate until it becomes 200 μm or less, the incident light easily reaches the surface on front side surface and the peripheral region is also thin, so that it is possible to design a wider imaging region, compared with the case where the peripheral region is thickened.

In a third back-illuminated solid-state image pickup device, the inorganic light shielding substance is obtained by evaporating a solvent from a solution in which carbon black is dissolved in the solvent. When the solvent is evaporated, the carbon black remains, and the carbon black adheres to the etched region.

In a fourth back-illuminated solid-state image pickup device, an accumulation layer having a higher impurity concentration than the semiconductor substrate is provided on the surface of the etched region. In the back-illuminated solid-state image pickup device, an accumulation layer having a higher impurity concentration than the semiconductor substrate is provided on the surface of the etched region, and the accumulation layer can prevent noise generated in the vicinity of the etched region from mixing into the signal charge flowing directly under the second charge transfer electrode group.

A method for manufacturing any of the above-described back-illuminated solid-state image pickup devices includes a step of performing etching, and a step of filling the inorganic light shielding substance, in which the step of filling a light shielding substance includes a step of filling the inorganic light shielding substance dissolved in the solvent in the etched region, and a step of evaporating the solvent.

Since the inorganic material is dissolved in the solvent, it can easily enter the etched region, which facilitates the working process.

Further, the step of performing etching includes a first etching step of forming a first recess of a first depth in the peripheral region of the light incident surface of the semiconductor substrate, and a second etching step of forming a second recess of a second depth in the peripheral region of the light incident surface of the semiconductor substrate, in which the first recess and the second recess are continuous and have different depths.

Since the deep recess functions as a reservoir for the light shielding substance, it is easy to control the thickness of the light shielding substance in the shallow recess.

Further, the above-described step of performing etching includes a step of forming a first recess and a second recess having the same depth and spaced apart from each other in the peripheral region of the light incident surface of the semiconductor substrate, and in the step of filling a light shielding substance, the light shielding substance is filled in the first recess and the second recess, and at the time of filling, a region from an opening end of the first recess to an opening end of the second recess is also coated with the light shielding substance.

That is, the number of recesses may be two or more, and in this case, the light shielding substance can be firmly fixed to the semiconductor substrate. Further, the light shielding substance is also present on a region from the first recess to the second recess. This region has an effect that the amount of the light shielding substance per unit area may be smaller than that in the recess.

Advantageous Effects of Invention

According to a back-illuminated solid-state image pickup device of the present invention, it is possible to capture an image with low noise in a vacuum environment.

BRIEF DESCRIPTION OF DRAWINGS

FIGS. 5(A), 5(B), and 5(C) are longitudinal sectional views of the back-illuminated solid-state image pickup device, for explaining a method for manufacturing the back-illuminated solid-state image pickup device having the structure illustrated in FIG. 4.

FIGS. 6(A), 6(B), and 6(C) are longitudinal sectional views of a back-illuminated solid-state image pickup device according to a second embodiment, for explaining a method for manufacturing the back-illuminated solid-state image pickup device.

FIGS. 7(A), 7(B), and 7(C) are longitudinal sectional views of a back-illuminated solid-state image pickup device according to a third embodiment, for explaining a method for manufacturing the back-illuminated solid-state image pickup device.

FIGS. 8(A), 8(B), and 8(C) are longitudinal sectional views of a back-illuminated solid-state image pickup device according to a fourth embodiment, for explaining a method for manufacturing the back-illuminated solid-state image pickup device.

FIGS. 9(A), 9(B), and 9(C) are longitudinal sectional views of a back-illuminated solid-state image pickup device according to a fifth embodiment, for explaining a method for manufacturing the back-illuminated solid-state image pickup device.

FIGS. 10(A), 10(B), and 10(C) are longitudinal sectional views of a modification example of the back-illuminated solid-state image pickup device illustrated in FIG. 5, for explaining the modification example of the back-illuminated solid-state image pickup device.

FIGS. 11(A), 11(B), and 11(C) are longitudinal sectional views of a modification example of the back-illuminated solid-state image pickup device illustrated in FIG. 6, for explaining the modification example of the back-illuminated solid-state image pickup device.

FIGS. 12(A), 12(B), and 12(C) are longitudinal sectional views of a modification example of the back-illuminated solid-state image pickup device illustrated in FIG. 7, for explaining the modification example of the back-illuminated solid-state image pickup device.

FIGS. 13(A), 13(B), and 13(C) are longitudinal sectional views of a modification example of the back-illuminated solid-state image pickup device illustrated in FIG. 8, for explaining the modification example of the back-illuminated solid-state image pickup device.

FIGS. 14(A), 14(B), and 14(C) are longitudinal sectional views of a modification example of the back-illuminated solid-state image pickup device illustrated in FIG. 9, for explaining the modification example of the back-illuminated solid-state image pickup device.

DESCRIPTION OF EMBODIMENTS

Figure 1:
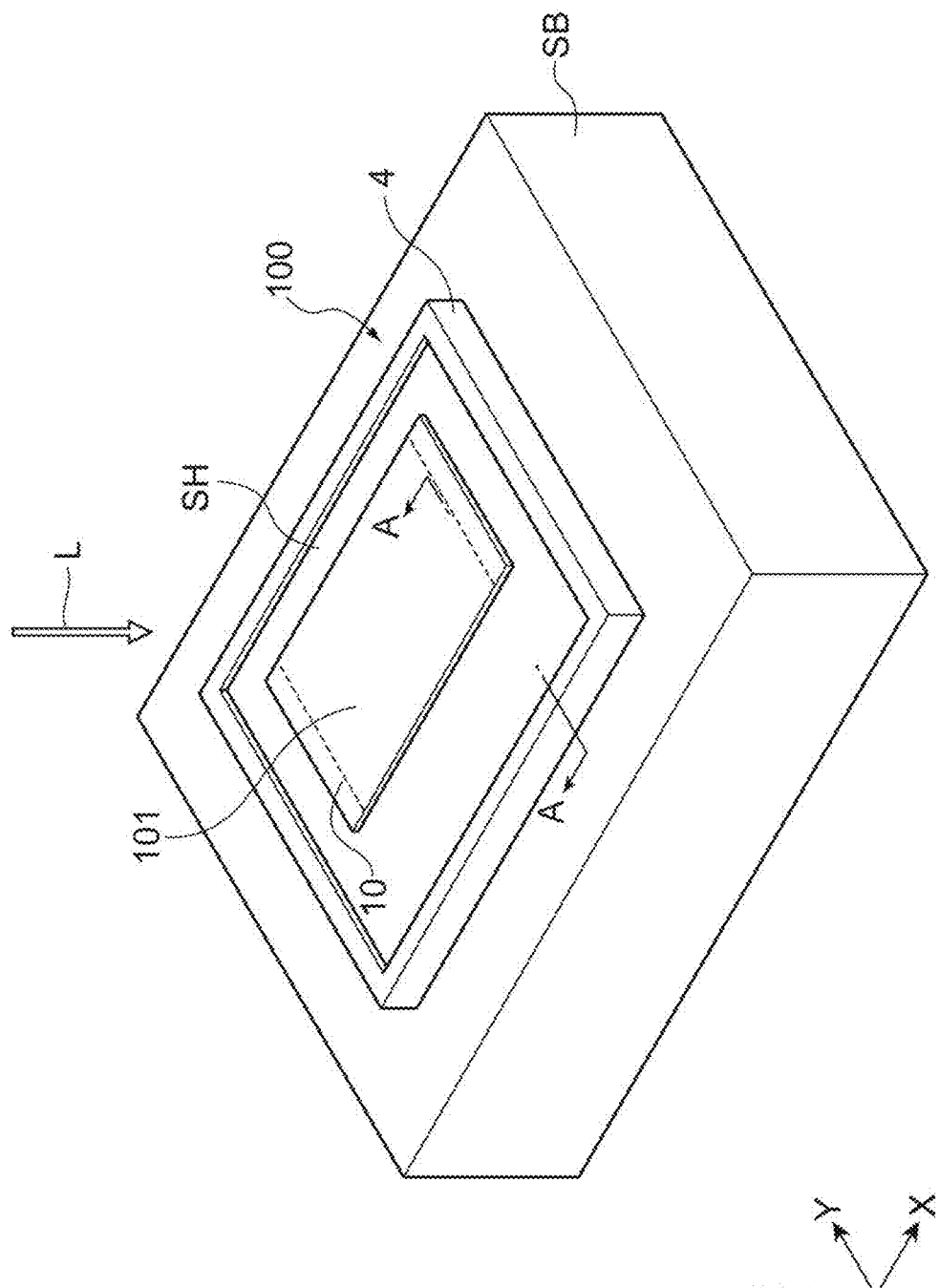
FIG. 1 is a perspective view illustrating a back-illuminated solid-state image pickup device and a support substrate.

Hereinafter, a back-illuminated solid-state image pickup device and a method for manufacturing the same of embodiments will be described. The same reference numerals are used for the same elements, and redundant explanations are omitted.

FIG. 1 is a perspective view illustrating a back-illuminated solid-state image pickup device and a support substrate.

When setting the XYZ three-dimensional cartesian coordinate system with the thickness direction of the back-illuminated solid-state image pickup device 100 as a Z-axis direction, the imaging region 10 where light is incident spreads in the XY plane.

The back-illuminated solid-state image pickup device 100 has a rectangular light receiving region 101 on the rear surface side, and a black light shielding substance SH (light shielding film). The most part of the light receiving region 101 is an imaging region 10 where charge transfer electrode groups are formed, and incident light L (light image) is detected in the imaging region 10. The peripheral region of the light receiving region 101 is shielded by the light shielding substance SH. The light shielding substance SH is for suppressing the generation of noise charges caused by the incidence of light to elements other than the imaging region and it is not necessary to provide it in all regions from the viewpoint of saving material. For example, in this example, the light shielding substance is not provided on the outer edge portion of the light incident surface (rear surface) of the semiconductor substrate 4. Needless to say, the light shielding substance can also be provided in such an outer edge portion.

The rear surface side of the semiconductor substrate 4 is etched, and the light shielding substance SH is filled in the etched region. In FIG. 1, since the peripheral region of the imaging region is shielded and the recess is filled with the light shielding substance SH, the adhesion strength of the recess is high, and the light shielding substance SH is hardly peeled off from the semiconductor substrate 4.

Further, since the back-illuminated solid-state image pickup device 100 has a small thickness, the surface on the front side is fixed on the support substrate SB for reinforcement. The support substrate SB is made of glass, Si, or the like, and is thicker than the back-illuminated solid-state image pickup device 100. It is also possible to incorporate a circuit for reading image signals output from the back-illuminated solid-state image pickup device 100 into the support substrate SB. Since the back-illuminated solid-state image pickup device 100 has electrode pads (bumps) for taking out various outputs and driving the imaging element on the surface on the front side, a drive and read circuit in the support substrate SB and the back-illuminated solid-state image pickup device 100 can be electrically connected to each other by the electrode pads.

Figure 2:
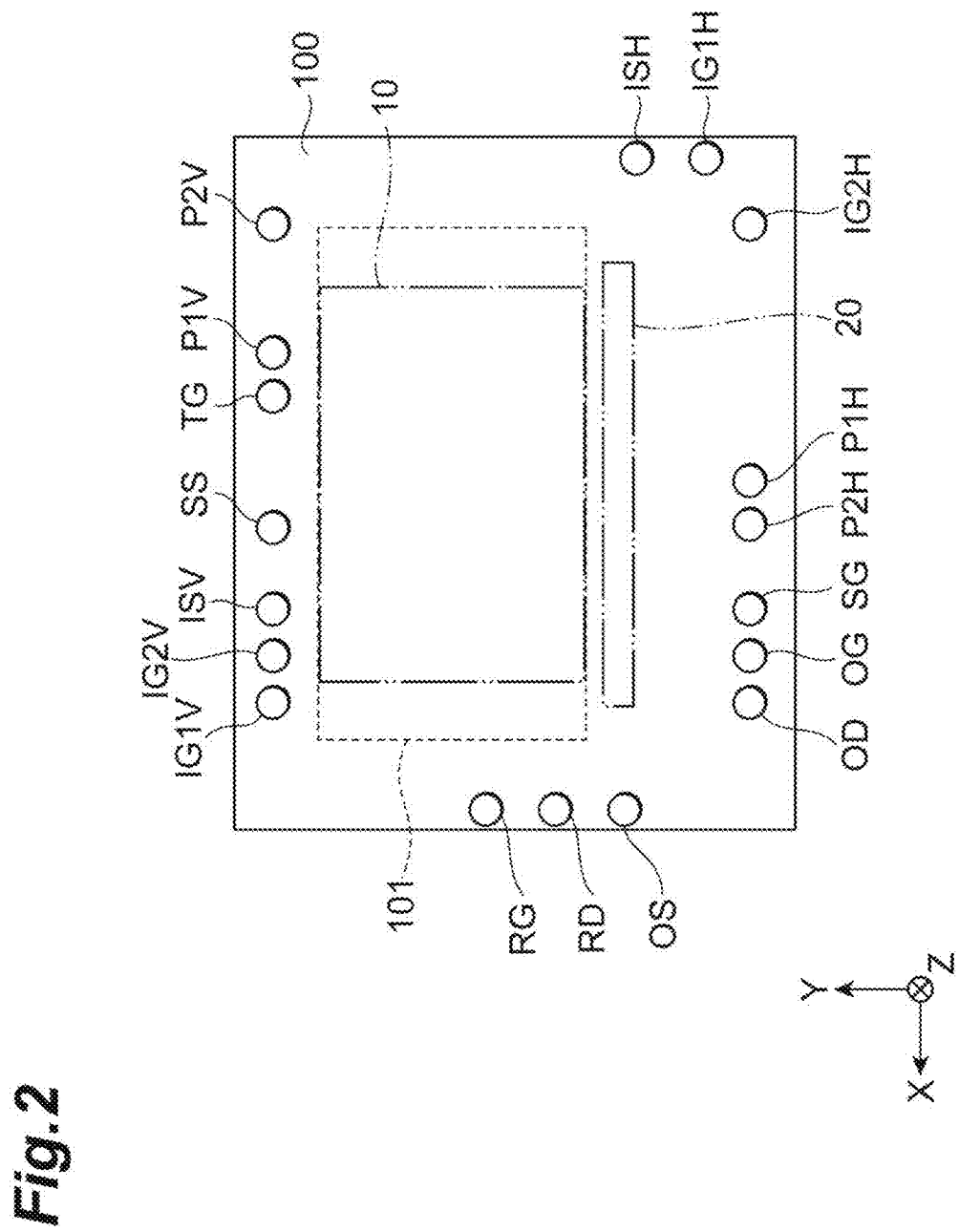
FIG. 2 is a plan view of the front side of the back-illuminated solid-state image pickup device.

FIG. 2 is a plan view of the front side of the back-illuminated solid-state image pickup device.

In the region corresponding to the light receiving region 101 of each of the semiconductor substrates (4A, 4C, and 4D in FIG. 4), the imaging region 10 is formed. The light image incident on the imaging region 10 is converted into a two-dimensional charge image, and this charge is transferred along the negative direction of the Y axis by the vertical shift register (first group of charge transfer electrodes). A horizontal shift register 20 (second group of charge transfer electrodes) is provided at the end of the charge transfer direction of the imaging region 10, and charges of each pixel transferred in the vertical direction are sequentially transferred in the X-axis direction (horizontal direction). A plurality of electrode pads are provided in the peripheral region on the side opposite to the light incident surface in the back-illuminated solid-state image pickup device 100.

The main electrode pads are electrode pads P1V and P2V for applying a two-phase transfer voltage to the charge transfer electrode, electrode pads P1H and P2H for applying a two-phase transfer voltage to the charge transfer electrode, an electrode pad SS for connecting the semiconductor substrate to the ground, and electrode pads SG, OG, OD, RG and RD for reading the charges transferred in the horizontal direction, and the output can be taken out from the electrode pad OS.

Other electrode pads may be appropriately provided according to the specifications, but in this example, other electrode pads include an electrode pad TG for making the charge transfer gate to the horizontal shift register 20 function, electrode pads ISV, ISH for inputting test signals, electrode pads 1G1V, 1G2V, 1G1H, and 1G2H for making the charge transfer gates of the test signals function. As a solid state imaging element, a charge coupled device (CCD) is known, in addition to a MOS type image sensor. As a CCD charge transfer system, a frame transfer system, an interline transfer system, a full frame transfer system, and the like are known. Many structures of such a CCD are known, and although not particularly limited, as an example, a CCD of a full frame transfer system will be described.

Figure 3:
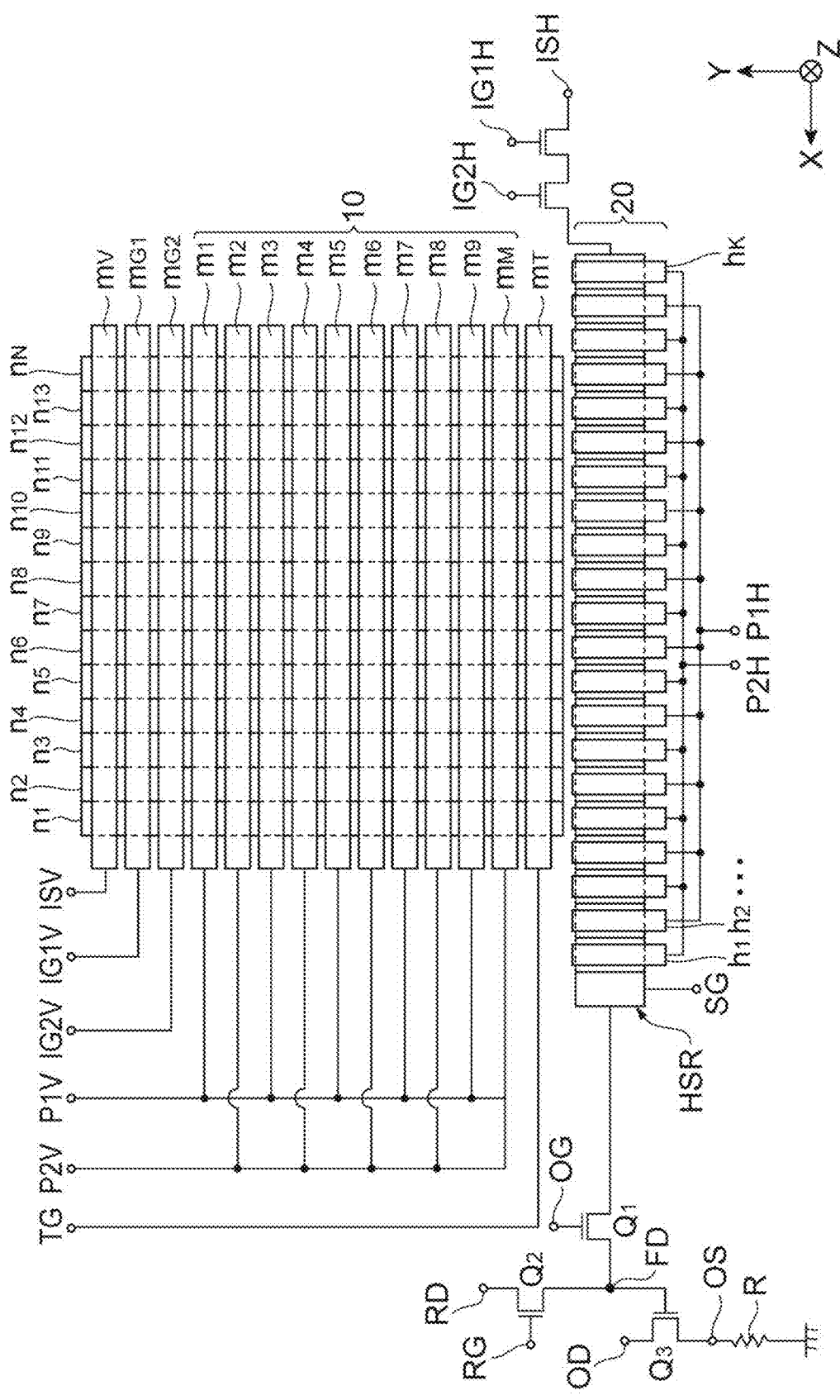
FIG. 3 is a diagram illustrating a charge transfer electrode group of the back-illuminated solid-state image pickup device.

FIG. 3 is a diagram illustrating charge transfer electrode groups of the back-illuminated solid-state image pickup device.

FIG. 3 is a view showing the imaging region 10 and the horizontal shift register 20 formed on the front side (the side opposite to the light incident surface (back surface)). It should be noted that FIG. 3 is a schematic view, and the shape of each transfer electrode extending in the X-axis direction is a rectangle and it is described that there is a gap between the transfer electrodes, but in reality, some or all of the transfer electrodes overlap.

In the imaging region 10, a plurality of vertical shift registers $n_1$ to $n_N$ (N is an integer of 2 or more), that is, vertical charge transfer CCDs are aligned. Note that the actual imaging region is the central region of the imaging region 10, and surrounding pixels are shielded as necessary. In other words, the above-described light shielding substance SH is provided in the peripheral region of the imaging region 10 shown in FIG. 1, but the formation region of the light shielding substance SH may be provided so as to cover the peripheral region of the vertical shift register.

The pixel in the vertical direction is an intersection region of each vertical CCD channel and each charge transfer electrode mk (k is an integer), and is disposed along the Y axis, and charge transfer electrodes $m_1$ to $m_M$ (M is an integer of 2 or more) extend along the X axis. Two-phase transfer voltages are applied to the charge transfer electrodes $m_1$ to $m_M$ from the electrode pads P1V and P2V, and charges accumulated in the semiconductor region directly under the charge transfer electrodes $m_1$ to $m_M$ are transferred in the vertical direction (Y-axis negative direction). An isolation region having a conductivity type opposite to the charges flowing through the CCD channel is formed between the vertical CCD channels (semiconductor charge transfer regions) constituting the respective vertical shift registers $n_1$ to $n_N$, and the isolation region suppresses mutual mixing of charges from different pixel columns.

A transfer gate electrode $m_T$ is provided at the final position of the charge transfer in the vertical direction, and depending on the voltage from the electrode pad TG, charges flow into the horizontal shift register 20 through the potential directly under the transfer gate electrode $m_T$ from the imaging region 10. The horizontal shift register 20 is an array of horizontal charge transfer CCDs that transfer charges in the horizontal direction (X-axis positive direction), and charge transfer electrodes $h_1$ to $h_K$ (K is an integer of 2 or more) are provided on the semiconductor charge transfer region HSR extending in the X-axis direction, and these charge transfer electrodes are arranged along the X-axis direction.

A two-phase transfer voltage is applied to the charge transfer electrodes $h_1$ to $h_K$ from the electrode pads P1H and P2H, and charges accumulated in the semiconductor region directly under the charge transfer electrodes $h_1$ to $h_K$ are transferred in the horizontal direction (X-axis direction). A charge readout circuit is provided at the final position of the charge transfer in the X axis. The charge readout circuit includes a signal gate region located at the end of the horizontal shift register connected to the electrode pad SG. Next to the signal gate region, a floating diffusion region FD is provided through a transistor Q1 having a MOS-FET structure. The floating diffusion region FD is connected to the reset drain electrode pad RD through the reset transistor Q2 and is also connected to the gate electrode of the output transistor Q3. One terminal of the output transistor Q3 is connected to the overflow drain electrode pad OD, and the other is connected to the output terminal OS. A load resistor R is connected to the output terminal OS. A reset gate electrode pad RG is connected to the gate electrode of the transistor $Q_2$.

An appropriate high level potential is applied to the electrode pads OG, OD, and RD all the time. At the time of signal readout, by setting the electrode pad SG and the electrode pad RG to a high level, setting the potential of the floating diffusion region FD to the reset potential of the reset electrode pad RD, and then setting the electrode pad RG to a low level, the output signal becomes a floating level. Next, by setting the electrode pad SG to the low level, the signal charges temporarily accumulated in the signal gate region flow into the floating diffusion region FD, and the output signal taken out from the electrode pad OS becomes a signal level according to the amount of accumulated charges.

The remaining configuration is for performing a test operation, and a test operation is performed by inputting a test signal from the electrode pads ISV, ISH, and applying an appropriate potential to the electrode pads IG1V, IG2V, IG1H, and IG2H. The electrode pad ISV is connected to an electrode $m_v$ electrically connected to the semiconductor substrate, and the electrode pads IG1V and IG2V are connected to gate electrodes $m_{G1}$, $m_{G2}$ provided on the CCD channel through an insulating film. In a case where an appropriate signal is input to these and an output different from the case of normal is obtained, it is determined to be abnormal.

The intersection region between each CCD channel $n_N$ and several transfer electrodes $m_M$ in FIG. 3 constitutes each pixel.

Figure 4:
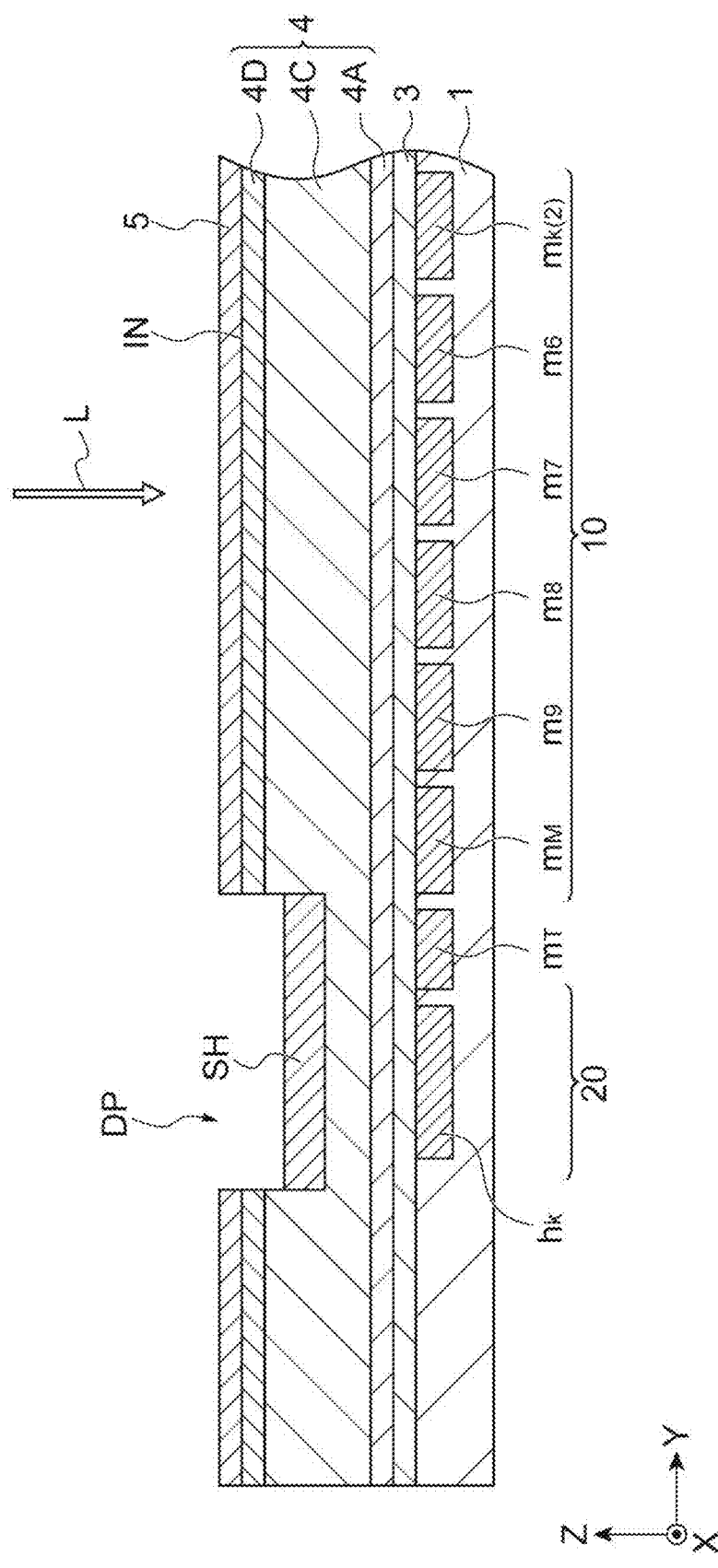
FIG. 4 is a longitudinal sectional view taken along an arrow A-A of the back-illuminated solid-state image pickup device illustrated in FIG. 1.

FIG. 4 is a longitudinal sectional view taken along an arrow A-A of the back-illuminated solid-state image pickup device illustrated in FIG. 1.

The back-illuminated solid-state image pickup device includes a semiconductor substrate 4(=4A, 4C, 4D) having a light incident surface IN, the first group of charge transfer electrodes $m_1$ to $m_M$ (vertical shift registers $n_1$ to $n_N$) provided on a surface opposite to the light incident surface IN of the semiconductor substrate 4, and the second group of charge transfer electrodes $h_1$ to $h_K$ (horizontal shift register 20) that further transfer the charges transferred from the first group of charge transfer electrodes $m_1$ to $m_M$ (vertical shift registers $n_1$ to $n_N$) in the horizontal direction.

The first group of charge transfer electrodes $m_1$ to $m_M$ is disposed in the imaging region 10, the second group of charge transfer electrodes $h_1$ to $h_K$ is disposed in the peripheral region of the imaging region 10, the light incident surface IN of the semiconductor substrate 4 corresponding to the peripheral region is etched, and the etched region DP is filled with the inorganic light shielding substance SH. The etched region DP in this example is a recess. As shown in FIG. 1, the formation region of this recess is a region where the light shielding substance SH surrounding the periphery of the imaging region 10 is disposed, and in a plan view, it surrounds the periphery of the imaging region 10 in a rectangular annular shape. A horizontal shift register 20 is disposed immediately below the light shielding substance SH, and the horizontal shift register 20 is protected from the incident light L.

The incident light L is incident from the back surface (light incident surface) of the semiconductor substrate 4. The pixel of the back-illuminated solid-state image pickup device includes, in order from the front side of the substrate, a protective film 1, a charge transfer electrode 2 (charge transfer electrodes $m_1$ to $m_M$: FIG. 3), an insulating layer 3, a semiconductor substrate 4 made of Si, and an antireflection film 5. The semiconductor substrate 4 includes a P-type semiconductor substrate 4C, an N-type semiconductor region (layer) 4A formed on the P-type semiconductor substrate 4C, and an accumulation layer 4D formed on the rear surface side of the P-type semiconductor substrate 4C. An isolation region (not shown) is faulted between adjacent CCD channels to suppress mixing of charges between adjacent CCD channels.

The P-type semiconductor substrate 4C and the N-type semiconductor region 4A are in contact with each other to form a PN junction, and constitutes a buried channel type CCD. The N-type semiconductor region 4A (PN junction) can be omitted, and in this case, the CCD functions as a surface channel type CCD.

In this example, the protective film 1 is made of Boro-Phospho Silicate Glass (BPSG), the charge transfer electrode 2 (charge transfer electrode $m_1$ to $m_M$) is made of polysilicon, and the insulating layer 3 is made of $SiO_2$, and the accumulation layer 4D between CCD channels and the accumulation layer 4D are made of Si to which a high concentration of P-type impurity is added. Note that in a pixel, the conductivity type in semiconductor functions even if P-type and N-type (a first conductivity type and a second conductivity type) are exchanged. The high concentration means that the impurity concentration is higher than the impurity concentration of the P-type semiconductor substrate 4C, and is preferably a concentration of $1 \times 10^{19}/cm^3$ or more.

According to the back-illuminated solid-state image pickup device, since the first group of charge transfer electrodes $m_1$ to $m_M$ (vertical shift register $n_1$ to $n_N$) is provided on the side opposite to the light incident surface IN, charges are generated in the imaging region in response to light incidence, without being obstructed by the electrode groups, and thus imaging with high sensitivity can be performed. The charges transferred by the first group of charge transfer electrodes $m_1$ to $m_M$ are read in the horizontal direction by the second charge transfer electrode group $h_k$ (k is an integer of 2 or more) and output. When light enters the peripheral region of the imaging region, it becomes unnecessary noise. In the back-illuminated solid-state image pickup device, the light incident surface of the semiconductor substrate corresponding to the peripheral region is etched, and the light shielding substance SH is filled in the etched region DP. Therefore, noise generation due to incidence of light in the peripheral region is suppressed. In addition, since the light shielding substance SH is an inorganic compound, the vapor pressure of the light shielding substance in the vacuum environment is lower than that of the organic compound, and generation of gas is suppressed.

A method for manufacturing a back-illuminated solid-state image pickup device having the above structure will be described.

FIGS. 5(A), 5(B), and 5(C) are longitudinal sectional views of the back-illuminated solid-state image pickup device, for explaining a method for manufacturing the back-illuminated solid-state image pickup device having the structure illustrated in FIG. 4.

First, as shown in FIG. 5(A), a P-type semiconductor substrate 4C is prepared, but the P-type semiconductor substrate 4C is thinned to a thickness of 200 μm or less at an appropriate time by chemical mechanical polishing. In the present example, it is 50 μm. In the case of thinning the semiconductor substrate before forming the remaining elements, the rear surface of the semiconductor substrate is attached on a support substrate such as a glass block, and the surface on the front side (the side in the —Z-axis direction). Thereafter, while peeling off the support substrate from the rear surface, another support substrate such as a glass block is attached to the surface on the front side, and the element on the rear surface side is processed.

In the case of thinning the semiconductor substrate after forming the elements on the front side, after forming the elements on the front side, a support substrate such as a glass block is attached to the surface on the front side and the elements on the rear side are processed.

In a case where the semiconductor substrate is first thinned, a mask is patterned in a region corresponding to the pixel, an isolation region is formed between CCDs by adding P-type impurities to the surface of the substrate on the front side by ion implantation method or diffusion method, and then thermal oxidation is performed to form an insulating layer 3 on the surface on the front side of the semiconductor substrate 4C, or on the isolation region. In the case where the insulating layer 3 is formed only on the isolation region, if the thermal oxidation is further performed after removing the mask, the insulating layer 3 made of SiO2 is also formed on the remaining surface of the semiconductor substrate 4 and on the light detection surface of silicon.

An N-type impurity is ion implanted into the semiconductor substrate through the insulating layer 3 to form an N-type semiconductor region 4A in a region directly under the insulating layer 3. Since the initial semiconductor substrate is the P-type semiconductor substrate 4C, a PN junction is formed between them. Next, a charge transfer electrode 2 made of a metal such as Al or polysilicon is formed on the insulating layer 3, and a protective film 1 made of BPSG is formed thereon.

Next, a high concentration P-type impurity is added to the rear surface side of the semiconductor substrate 4 to form an accumulation layer 4D, and then an antireflection film 5 is formed on the accumulation layer 4D. The antireflection film 5 is made of a dielectric multilayer film and is formed by stacking oxides of Si and Ge, for example. For stacking, a sputtering method or a CVD method can be used. Although the above-described back-illuminated solid-state image pickup device is completed through the above steps, in reality, since the charge transfer electrodes 2 adjacent to each other (charge transfer electrode $m_1$ to $m_M$) are overlapped, after forming the charge transfer electrodes 2 of a low layer (for example, odd-numbered ones among the charge transfer electrode $m_1$ to $m_M$), an insulating layer made of SiO$_2$ and serving as a spacer is formed so as to be continuous with the initial insulating layer 3, and the charge transfer electrodes 2 of an upper layer (for example, even numbered ones among the charge transfer electrode $m_1$ to $m_M$) are formed through the spacer.

Next, as shown in FIG. 5(B), a region DP to be etched is formed. To form the region DP to be etched, a mask is patterned in the surrounding region, and the inside of the opening of the mask is etched.

On the rear surface side, an antireflection film 5 and an accumulation layer 4D are formed. In a case where the antireflection film 5 is a stacked body of SiO$_2$ and GeO$_2$, for example, an aqueous hydrofluoric acid solution can be used as the etchant. Since the accumulation layer 4D is made of the same material as the semiconductor substrate 4C, an aqueous hydrofluoric acid solution can be used as long as it is Si. Dry etching using a reactive ion etching (RIB) method, argon sputtering or the like is also possible. KOH (potassium hydroxide), TMAH (tetramethylammonium hydroxide) or the like can be used as an etchant for the wet etching of the Si semiconductor substrate.

The depth te of the etching is set to several μm to several tens μm. In particular, in a case of using carbon black as the light shielding substance SH, it is preferable that te=2 to 3 μm or more in order to obtain sufficient light shielding property, but in a case where the thickness tt of the P-type semiconductor substrate 4C excluding the N-type semiconductor layer 4A is 50 μm, the etched remaining thickness tr is set to tt−te=tr=48 μm or more.

Finally, as shown in FIG. 5(C), the light shielding substance SH is filled in the etched region DP. The light shielding substance is made of an inorganic compound.

Since the inorganic compound is not an organic compound and it is not a metal, it is a substance which does not have gloss. Therefore, not only gas generation is suppressed, but also reflectance is lower than that of metal, so that reflected light can be prevented from becoming new noise as stray light in an exposure apparatus.

As the inorganic compound, black carbon, black ceramic, or black metal oxide can be used. As the inorganic compound, an inorganic compound having a light shielding effect such as silica beads can also be used.

As the black carbon, hydrophilic carbon black, hydrophobic carbon black, carbon nanotube, or the like can be used. As the black ceramic, Co—Cr—Fe, Co—Mn—Fe or the like can be used. As the black metal oxide, black iron oxide, titanium oxide, and other metal oxide pigments (mineral pigments) can be used. In addition, in a case where the solute is a hydrophilic material, the solvent with water as a main component can be used, and in the case of a hydrophobic material, oil, thinner, alcohol or the like can be used.

As an example, after a substance in which a hydrophilic carbon black dissolved in water is filled in a region DP constituting a recess, it is dried and solidified to form a light shielding substance SH. The solvent evaporates in drying.

A material using a resin such as polypropylene or polyethylene as a binder of carbon black may be used as the light shielding substance SH. In this case, binder is dissolved in an organic solvent such as acetone, carbon black is mixed with the binder, and the region DP is filled with the binder, followed by drying and solidification to form a light shielding substance SH.

The thickness of the light shielding substance SH in the Z-axis direction is equal to or less than the depth te of the etched region DP. From the viewpoint of light shielding property, the thickness of the light shielding substance SH satisfies the same condition as the depth te of the above-mentioned etched region DP.

The positional relationship between the light shielding substance SH, the accumulation layer 4D and the antireflection film 5 in the recess can be changed as shown in FIG. 10 to FIG. 14.

The thickness of the above-described semiconductor substrate 4 is 200 μm or less in both the imaging region 10 and the peripheral region. By polishing the entire semiconductor substrate 4 until it becomes 200 μm or less, the incident light easily reaches the surface on front side surface and the peripheral region is also thin, so that there is an advantage that it is possible to design a wider imaging region 10, compared with the case where the peripheral region is thickened.

The inorganic light shielding substance SH is obtained by evaporating a solvent from a solution in which carbon black is dissolved in the solvent. When the solvent is evaporated, the carbon black remains, and the carbon black adheres to the etched region.

As described above, the above-described manufacturing method includes a step of performing etching, and a step of filling the inorganic light shielding substance SH, in which the step of filling a light shielding substance SH includes a step of filling the inorganic light shielding substance SH dissolved in the solvent in the etched region DP, and a step of evaporating the solvent.

Since the inorganic material is dissolved in the solvent, it can easily enter the etched region DP, which facilitates the working process.

Further, in this example, the step of performing etching includes a first etching step of forming a first recess (region DP) of a first depth in the above-described peripheral region (the peripheral region of the imaging region, in particular, in a region where a horizontal shift register is formed) of the light incident surface IN of the semiconductor substrate 4.

FIGS. 6(A), 6(B), and 6(C) are longitudinal sectional views of a back-illuminated solid-state image pickup device according to a second embodiment, for explaining a method for manufacturing the back-illuminated solid-state image pickup device.

This manufacturing method differs from the method shown in FIG. 5 only in the formation method for the region DP to be etched. That is, this method includes a second etching step of forming a second recess DP2 of a second depth in the peripheral region (a region outside the first recess DP1) of the light incident surface IN of the semiconductor substrate, in addition to the step of forming the first recess (DP1) by the first etching step.

In this manufacturing method, similarly to the above-described method, first, a back-illuminated solid-state image pickup device is formed (FIG. 6(A)), next, regions (DP1, DP2) for filling a light shielding substance are formed (FIG. 6(B)), and finally, the regions (DP1, DP2) are filled with a light shielding substance (FIG. 6(C)). The material of the etchant and the like may be the same as those described above.

Further, the first recess DP1 and the second recess DP2 are continuous and have different depths. In this example, the second recess DP2 is set to be deeper than the first recess DP1. The deep second recess DP2 functions as a reservoir for storing the liquid of the light shielding substance SH and it is easy to control the thickness of the light shielding substance SH in the first recess DP1.

FIGS. 7(A), 7(B), and 7(C) are longitudinal sectional views of a back-illuminated solid-state image pickup device according to a third embodiment, for explaining a method for manufacturing the back-illuminated solid-state image pickup device.

In this manufacturing method, similarly to the above-described method, first, a back-illuminated solid-state image pickup device is formed (FIG. 7(A)), next, a region (DP1) for filling a light shielding substance is formed (FIG. 7(B)), and finally, the region (DP1) are filled with a light shielding substance SH (FIG. 7(C)). The material of the etchant and the like may be the same as those described above.

Here, the region DP to be etched differs from that shown in FIG. 6 only in that the depth differs continuously. That is, the depth of the recess is larger toward the outer edge of the substrate. The etching in this case, similar to the first recess and the second recess, the first to Nth recesses (N is 3 or more) are set, and adjacent recesses are formed in a plurality of steps, and finally, by performing etching so as to cover the whole recess group, it is possible to form a recess having a slope.

FIGS. 8(A), 8(B), and 8(C) are longitudinal sectional views of a back-illuminated solid-state image pickup device according to a fourth embodiment, for explaining a method for manufacturing the back-illuminated solid-state image pickup device.

In this manufacturing method, similarly to the above-described method, first, a back-illuminated solid-state image pickup device is formed (FIG. 8(A)), next, regions (DP3, DP4) for filling a light shielding substance are formed (FIG. 8(B)), and finally, the regions (DP3, DP4) are filled with a light shielding substance SH (FIG. 8(C)). The material of the etchant and the like may be the same as those described above.

Here, the regions to be etched are the same in depth, separated from each other, and differs from that shown in FIG. 6 only in that the light shielding substance SH is present on the region between the recesses formed by etching.

That is, the step of performing etching in FIG. 8(B) includes a step of forming a first recess DP3 and a second recess DP4 which are spaced apart at the same depth in the peripheral region of the light incident surface IN of the semiconductor substrate 4.

In addition, in the step of filling the light shielding substance SH shown in FIG. 8(C), the light shielding substance SH is filled in the first recess DP3 and the second recess DP3, and in this filling, and the region from the opening end of the first recess DP3 to the opening end of the second recess DP3 is also coated with the light shielding substance SH.

Further, the number of recesses may be two or more, and in this case, the light shielding substance SH can be firmly fixed to the semiconductor substrate. Further, the light shielding substance SH is also present on a region from the first recess DP3 to the second recess DP4. This region has an effect that the amount of the light shielding substance per unit area may be smaller than that in the recess.

Further, the recess DP3 and the recess DP4 can be formed at the same time, and when viewed from the Z-axis direction, a rectangular annular shape can be formed. In this case, although the recesses DP3 and DP4 are separated from each other in the longitudinal sectional view, they are continuous in plan view. Since the second group of charge transfer electrodes is located directly under the central region of the rectangular annular recess, if the central region is also coated with the light shielding substance, the recess surrounding the periphery functions as a buffer which is a reservoir, and there is an effect that the solution does not leak out of the rectangular annular recess. Further, the recess DP3 and the recess DP4 can also shield the light which is going to be incident from the lateral direction toward the second group of charge transfer electrodes at a shallow inclination angle.

FIGS. 9(A), 9(B), and 9(C) are longitudinal sectional views of a back-illuminated solid-state image pickup device according to a fifth embodiment, for explaining a method for manufacturing the back-illuminated solid-state image pickup device.

In this manufacturing method, similarly to the above-described method, first, a back-illuminated solid-state image pickup device is formed (FIG. 9(A)), next, regions (DP1, DP5, DN) for filling a light shielding substance are formed (FIG. 9(B)), finally, the regions (DP1, DP5, DN) are filled with a light shielding substance SH (FIG. 9(C)), and further an extra portion near the outer edge of the substrate is cut along a cutting line CUT. The material of the etchant and the like may be the same as those described above.

Here, This manufacturing method is different from that shown in FIG. 6 only in the step of forming the regions (DP1, DP5, DN) for filling the light shielding substance and the subsequent cutting step.

This method includes a second etching step of forming a second recess DP5 of a second depth, which is continuous with the first recess (DP1), in the peripheral region (a region outside the first recess DP1) of the light incident surface IN of the semiconductor substrate, in addition to the step of forming the first recess (DP1) by the first etching step. However, the bottom surface of the second recess DP5 extends to the side surface of the outer edge of the substrate, and forms a step with the side surface of the substrate. Further, the first recess DP1 and the second recess DP5 are continuous through a step, and the second recess DP5 on the outer side is deeper. Here, a rectangular annular block BL for blocking the light shielding substance is disposed so as to surround the semiconductor substrate. Thus, the recess DN is formed in the gap between the side surface of the semiconductor substrate and the rectangular annular block BL.

The deep second recess DP2 and the recess DN of the gap function as a reservoir for storing the liquid of the light shielding substance SH and it becomes easier to control the thickness of the light shielding substance SH in the first recess DP1. The light shielding substance SH is filled, and then is dried and solidified, and a part of the substrate can be cut along the cutting line CUT. The cutting line CUT forms a rectangle extending parallel to the four side surfaces of the substrate in the XY plane. It is possible to remove unnecessary light shielding substance portion filled in the recess DN of the gap by this cutting, but it is also possible to use it while leaving the annular rectangular block BL without cutting.

As described above, in the above-described back-illuminated solid-state image pickup device, the first group of charge transfer electrodes (vertical shift register) is present in the imaging region 10, the second group of charge transfer electrodes (horizontal shift register) is present in the peripheral region of the imaging region 10, the light incident surface IN of the semiconductor substrate 4 corresponding to the peripheral region is etched, and the etched region is filled with the inorganic light shielding substance SH. Since the amount of the inorganic light shielding substance that evaporates and vaporizes under the vacuum environment is extremely small, and the influence on the imaging by the vaporized gas is small, the back-illuminated solid-state image pickup device can capture an image with low noise in a vacuum environment.

FIGS. 10(A), 10(B), and 10(C) are longitudinal sectional views of a modification example of the back-illuminated solid-state image pickup device illustrated in FIG. 5, for explaining the modification example of the back-illuminated solid-state image pickup device.

In the example shown in FIG. 5, the accumulation layer and the antireflection film 5 are not formed in the etched region DP (recess). In the case of this structure, there is a possibility that noise carriers generated on the inner wall surface of the recess mix into signal carriers transferred by the horizontal shift register, or crosstalk may occur. In the modification example shown in FIG. 10, the accumulation layer 4D and the antireflection film 5 are formed in the etched region DP, and the light shielding substance SH is filled on the antireflection film 5 in the recess. In a case of this structure, the manufacturing method is slightly different from that shown in FIG. 5.

That is, first, as shown in FIG. 10(A), a P-type semiconductor substrate 4C is prepared, but the P-type semiconductor substrate 4C is thinned to a thickness of 200 μm or less at an appropriate time by chemical mechanical polishing. In the present example, it is 50 μm. In the case of thinning the semiconductor substrate before forming the remaining elements, the rear surface of the semiconductor substrate is attached on a support substrate such as a glass block, and the surface on the front side (the side in the —Z-axis direction). Thereafter, while peeling off the support substrate from the rear surface, another support substrate such as a glass block is attached to the surface on the front side, and the element on the rear surface side is processed.

In the case of thinning the semiconductor substrate after forming the elements on the front side, after forming the elements on the front side, a support substrate such as a glass block is attached to the surface on the front side and the elements on the rear side are processed.

In a case where the semiconductor substrate is first thinned, a mask is patterned in a region corresponding to the pixel, an isolation region is formed between CCDs by adding P-type impurities to the surface of the substrate on the front side by ion implantation method or diffusion method, and then thermal oxidation is performed to form an insulating layer 3 on the surface on the front side of the semiconductor substrate 4C, or on the isolation region. In the case where the insulating layer 3 is formed only on the isolation region, if the thermal oxidation is further performed after removing the mask, the insulating layer 3 made of SiO2 is also formed on the remaining surface of the semiconductor substrate 4 and on the light detection surface of silicon.

An N-type impurity is ion implanted into the semiconductor substrate through the insulating layer 3 to form an N-type semiconductor region 4A in a region directly under the insulating layer 3. Since the initial semiconductor substrate is the P-type semiconductor substrate 4C, a PN junction is formed between them. Next, a charge transfer electrode 2 made of a metal such as Al or polysilicon is formed on the insulating layer 3, and a protective film 1 made of BPSG is formed thereon.

Next, as shown in FIG. 10(B), a region DP (recess) to be etched is formed. To form the region DP to be etched, a mask is patterned in the surrounding region, and the inside of the opening of the mask is etched. Since the semiconductor substrate is Si, KOH (potassium hydroxide), TMAH (tetramethylammonium hydroxide) or the like can be used as an etchant for the wet etching. In addition, a dry etching method such as argon sputtering or a reactive ion etching (RIE) method can also be used.

The depth to of the etching is set to several μm to several tens μm. In particular, in a case of using carbon black as the light shielding substance SH, it is preferable that te=2 to 3 μm or more in order to obtain sufficient light shielding property, but in a case where the thickness tt of the P-type semiconductor substrate 4C excluding the N-type semiconductor layer 4A is 50 μm, the etched remaining thickness tr is set to tt−te=tr=48 μm or more.

Next, as shown in FIG. 10(C), a high concentration P-type impurity is added to the rear surface side of the semiconductor substrate 4 to form an accumulation layer 4D. Subsequently, an antireflection film 5 (a stacked body of $SiO_2$ and $GeO_2$: formed by a sputtering method) is formed on the accumulation layer 4D, and the light shielding substance SH (inorganic compound) is filled in the recess similarly to the above-described method. The antireflection film 5 is made of a dielectric multilayer film and is formed by stacking oxides of Si and Ge, for example. The accumulation layer 4D is made of Si to which a high concentration ($1 \times 10^{19}$/cm$^3$ or more) of P-type impurity (for example, boron) is added.

Impurity addition methods include an ion implantation method and a diffusion method. In the case of using the ion implantation method, since it is difficult for impurities to be added to the side wall of the recess, it is preferable to use the diffusion method. A dopant source such as $BF_3$, $BCl_3$, $B_2H_6$ or the like can be used for boron dope. The dopant gas is diluted with $N_2$ and introduced together with oxygen into the vacuum chamber. When the substrate is heated at 600° C., an oxide thin film is deposited on the surface. For example, when heated at 950° C. for 30 minutes in an oxygen gas, the dopant in the deposited thin film diffuses into the Si substrate to form an accumulation layer.

The accumulation layer 4D can be formed before forming the antireflection film 5, but it can also be formed after the antireflection film 5 is formed. That is, impurities can be added into the Si substrate through the antireflection film 5.

The inorganic light shielding substance SH is obtained by evaporating a solvent from a solution in which carbon black is dissolved in the solvent. When the solvent is evaporated, the carbon black remains, and the carbon black adheres on the antireflection film 5, in the etched region DP.

Although the above-described back-illuminated solid-state image pickup device is completed through the above steps, in reality, since the charge transfer electrodes 2 adjacent to each other (charge transfer electrode $m_1$ to $m_M$) are overlapped, after forming the charge transfer electrodes 2 of a low layer (for example, odd-numbered ones among the charge transfer electrode $m_1$ to $m_M$), an insulating layer made of $SiO_2$ and serving as a spacer is formed so as to be continuous with the initial insulating layer 3, and the charge transfer electrodes 2 of an upper layer (for example, even numbered ones among the charge transfer electrode $m_1$ to $m_M$) are formed through the spacer.

The thicknesses of the light shielding substance SH and the semiconductor substrate in the Z-axis direction and the like are the same as those in the case of FIG. 5.

FIGS. 11(A), 11(B), and 11(C) are longitudinal sectional views of a modification example of the back-illuminated solid-state image pickup device illustrated in FIG. 6, for explaining the modification example of the back-illuminated solid-state image pickup device.

In the case of the example shown in FIG. 6, the accumulation layer and the antireflection film 5 are not formed in the etched region DP (recess), but in the case of the structure of FIG. 11, the accumulation layer 4D and the antireflection film 5 are formed, and the light shielding substance SH is filled on the antireflection film 5 in the recess. This reduces the possibility that noise carriers generated on the bottom surface or the side surface of the recess mix into signal carriers transferred by the horizontal shift register or crosstalk may occur.

This manufacturing method differs from the method shown in FIG. 10 only in the formation method of the region DP to be etched. That is, this method includes a second etching step of forming a second recess DP2 of a second depth in the peripheral region (a region outside the first recess DP1) of the light incident surface IN of the semiconductor substrate, in addition to the step of forming the first recess (DP1) by the first etching step.

In this manufacturing method, similarly to the above-described method, first, a back-illuminated solid-state image pickup device is formed (FIG. 11(A)), next, regions (DP1, DP2) for filling a light shielding substance are formed (FIG. 11(B)), the accumulation layer 4D and the antireflection film 5 are formed in the regions (DP1, DP2) and the entire rear surface of the semiconductor substrate 4C, and then finally, the recess is filled with a light shielding substance (FIG. 11(C)). The material of the etchant and the like may be the same as those described above.

Further, the first recess DP1 and the second recess DP2 are continuous and have different depths. In this example, the second recess DP2 is set to be deeper than the first recess DP1. The deep second recess DP2 functions as a reservoir for storing the liquid of the light shielding substance SH and it is easy to control the thickness of the light shielding substance SH in the first recess DP1.

FIGS. 12(A), 12(B), and 12(C) are longitudinal sectional views of a modification example of the back-illuminated solid-state image pickup device illustrated in FIG. 7, for explaining the modification example of the back-illuminated solid-state image pickup device.

As shown in FIG. 12(C), it differs from the example shown in FIG. 7 in that after forming the accumulation layer 4D and the antireflection film 5 on the inner wall surface and the entire back surface of the recess DP, the light shielding substance SH is filled on the antireflection film 5 in the recess. In this manufacturing method, similarly to the above-described method, first, a back-illuminated solid-state image pickup device is formed (FIG. 12(A)), next, a region (DP) for filling a light shielding substance is formed (FIG. 12(B)), and finally, the region (DP1) are filled with a light shielding substance SH (FIG. 12(C)). The material of the etchant and the like may be the same as those described above.

Here, the region DP to be etched differs from that shown in FIG. 11 only in that the depth differs continuously. That is, the depth of the recess is larger toward the outer edge of the substrate. The etching in this case, similar to the first recess and the second recess, the first to Nth recesses (N is 3 or more) are set, and adjacent recesses are formed in a plurality of steps, and finally, by performing etching so as to cover the whole recess group, it is possible to form a recess having a slope.

FIGS. 13(A), 13(B), and 13(C) are longitudinal sectional views of a modification example of the back-illuminated solid-state image pickup device illustrated in FIG. 8, for explaining the modification example of the back-illuminated solid-state image pickup device. As shown in FIG. 13(C), it differs from the example shown in FIG. 8 in that after forming the accumulation layer 4D and the antireflection film 5 on the inner wall surface and the entire back surface of the recess DP, the light shielding substance SH is filled on the antireflection film 5 in the recess. The other steps are the same as those shown in FIG. 8.

Also in this manufacturing method, similarly to the above-described method, first, a back-illuminated solid-state image pickup device is formed (FIG. 13(A)), next, etching is performed to form regions (DP3, DP4) for filling a light shielding substance (FIG. 13(B)), and finally, after the accumulation layer 4D and the antireflection film 5 are formed in the inner wall surfaces and the entire rear surfaces of the regions (DP3, DP4), a light shielding substance SH is filled (FIG. 13(C)). The material of the etchant, the materials, manufacturing method, and the like of the accumulation layer 4D and the antireflection film 5 may be the same as in the case of FIG. 10.

FIGS. 14(A), 14(B), and 14(C) are longitudinal sectional views of a modification example of the back-illuminated solid-state image pickup device illustrated in FIG. 9, for explaining the modification example of the back-illuminated solid-state image pickup device.

As shown in FIG. 14(C), it differs from the example shown in FIG. 9 in that after forming the accumulation layer 4D and the antireflection film 5 on the inner wall surface and the entire back surface of the recess DP, the light shielding substance SH is filled on the antireflection film 5 in the recess. The other steps are the same as those shown in FIG. 9.

In this manufacturing method, similarly to the above-described method, first, a back-illuminated solid-state image pickup device is formed (FIG. 14(A)), next, etching is performed to form regions (DP1, DP5) for filling a light shielding substance (FIG. 14(B)), and finally, after the accumulation layer 4D and the antireflection film 5 are formed on the inner wall surfaces and the entire rear surfaces of the regions (DP1, DP5), a light shielding substance SH is filled (FIG. 14(C)). The material of the etchant, the materials, manufacturing method, and the like of the accumulation layer 4D and the antireflection film 5 may be the same as in the case of FIG. 10.

In the above back-illuminated solid-state image pickup device illustrated in FIG. 10 to FIG. 14, an accumulation layer 4D having a higher impurity concentration than the semiconductor substrate 4C is provided on the surface of the etched region, and the accumulation layer 4D can prevent noise generated in the vicinity of the etched region from mixing into the signal charge flowing directly under the second group of charge transfer electrodes.

REFERENCE SIGNS LIST

4 SEMICONDUCTOR SUBSTRATE
IN LIGHT INCIDENT SURFACE
$m_1$ to $m_M$ FIRST GROUP OF CHARGE TRANSFER ELECTRODES
$h_1$ to $h_K$ SECOND GROUP OF CHARGE TRANSFER ELECTRODES

The invention claimed is:

1. A back-illuminated solid-state image pickup device comprising:
a semiconductor substrate having a light incident surface;
a first group of charge transfer electrodes provided on a surface of the semiconductor substrate opposite to the light incident surface; and
a second group of charge transfer electrodes configured to further transfer charges transferred by the first group of charge transfer electrodes in a horizontal direction,
wherein the first group of charge transfer electrodes is disposed in an imaging region,
wherein the second group of charge transfer electrodes is disposed in a peripheral region around the imaging region, and
wherein the light incident surface of the semiconductor substrate includes an etched region corresponding to the peripheral region around the imaging region, and an inorganic light shielding substance is filled in the etched region.

2. The back-illuminated solid-state image pickup device according to claim 1,
wherein a thickness of the semiconductor substrate is 200 µm or less in both the imaging region and the peripheral region.

3. The back-illuminated solid-state image pickup device according to claim 1,
wherein the inorganic light shielding substance is obtained by evaporating a solvent from a solution in which carbon black is dissolved in the solvent.

4. The back-illuminated solid-state image pickup device according to claim 1,
wherein an accumulation layer is provided on a surface of the etched region, and
wherein an impurity concentration of the accumulation layer is higher than an impurity concentration of the semiconductor substrate.

5. A back-illuminated solid-state image pickup device comprising:
a semiconductor substrate including:
an imaging region, and
a peripheral region around the imaging region and including a recess on a light incident surface;
a first group of charge transfer electrodes arranged in a vertical charge transfer direction, disposed in the imaging region and provided on a surface of the semiconductor substrate opposite to the light incident surface;
a second group of charge transfer electrodes arranged in a horizontal charge transfer direction, disposed in the peripheral region and provided on the surface of the semiconductor substrate opposite to the light incident surface, the second group of charge transfer electrodes being adjacent to an end of the first group of charge transfer electrodes; and
an inorganic light shielding substance provided in the recess.

6. The back-illuminated solid-state image pickup device according to claim 5,
wherein a thickness of the semiconductor substrate is 200 µm or less in both the imaging region and the peripheral region.

7. The back-illuminated solid-state image pickup device according to claim 5,
wherein the inorganic light shielding substance includes a carbon black.

8. The back-illuminated solid-state image pickup device according to claim 5, further comprising an accumulation layer provided on a surface of the recess, wherein an impurity concentration of the accumulation layer is higher than an impurity concentration of the semiconductor substrate.

* * * * *